United States Patent [19]
Ohmori et al.

[11] Patent Number: 5,841,317
[45] Date of Patent: Nov. 24, 1998

[54] DIFFERENTIAL AMPLIFIER CIRCUIT WITH A HIGH THROUGH PUT RATE AND REDUCED POWER CONSUMPTION

[75] Inventors: Tetsurou Ohmori, Hirakata; Yoshito Date, Otsu; Takashi Koizumi, Kusatsu; Yoshio Imamura, Otsu; Osamu Sarai, Takatsuki, all of Japan

[73] Assignee: Matsushita Electric Industrial Co., Ltd., Osaka-fu, Japan

[21] Appl. No.: 606,945

[22] Filed: Feb. 26, 1996

[30] Foreign Application Priority Data

Feb. 27, 1995 [JP] Japan .................................. 7-038185
Dec. 7, 1995 [JP] Japan .................................. 7-318943

[51] Int. Cl.$^6$ ............................ H03F 3/45; H03K 3/023; H03K 17/04
[52] U.S. Cl. ........................... 327/563; 327/65; 327/111; 327/374; 330/253; 330/255
[58] Field of Search ................................. 327/563, 53, 54, 327/65, 67, 66, 111, 205, 374, 376, 377, 379, 387, 380, 381, 389; 330/259, 260, 255, 253, 295; 326/21, 26, 27, 29, 31, 87

[56] References Cited

U.S. PATENT DOCUMENTS

| | | | |
|---|---|---|---|
| 4,462,002 | 7/1984 | Schade, Jr. .............................. | 330/259 |
| 5,027,013 | 6/1991 | Coy et al. ................................. | 326/77 |
| 5,144,259 | 9/1992 | Yoshida ................................... | 330/255 |
| 5,220,288 | 6/1993 | Brooks .................................... | 330/255 |
| 5,338,980 | 8/1994 | Ovens ..................................... | 327/374 |
| 5,457,433 | 10/1995 | Westwick ............................... | 327/374 |
| 5,606,287 | 2/1997 | Kobayashi et al. ..................... | 330/255 |

*Primary Examiner*—Timothy P. Callahan
*Assistant Examiner*—Terry L. Englund
*Attorney, Agent, or Firm*—Wenderoth, Lind & Ponack, L.L.P.

[57] ABSTRACT

A differential amplifier achieving a high throughput rate with reduced power consumption includes a differential circuit, output circuit, a constant current source transistor, a drive transistor, and a switching circuit. A difference voltage relative to a difference between voltages applied to non-inverting and inverting inputs of the differential circuit is applied to the switching circuit. The switching circuit supplies a drive signal to the drive transistor to enable the drive transistor when the difference voltage is below a predetermined threshold voltage, and to disable the drive transistor when the difference voltage is above the predetermined threshold voltage.

20 Claims, 14 Drawing Sheets

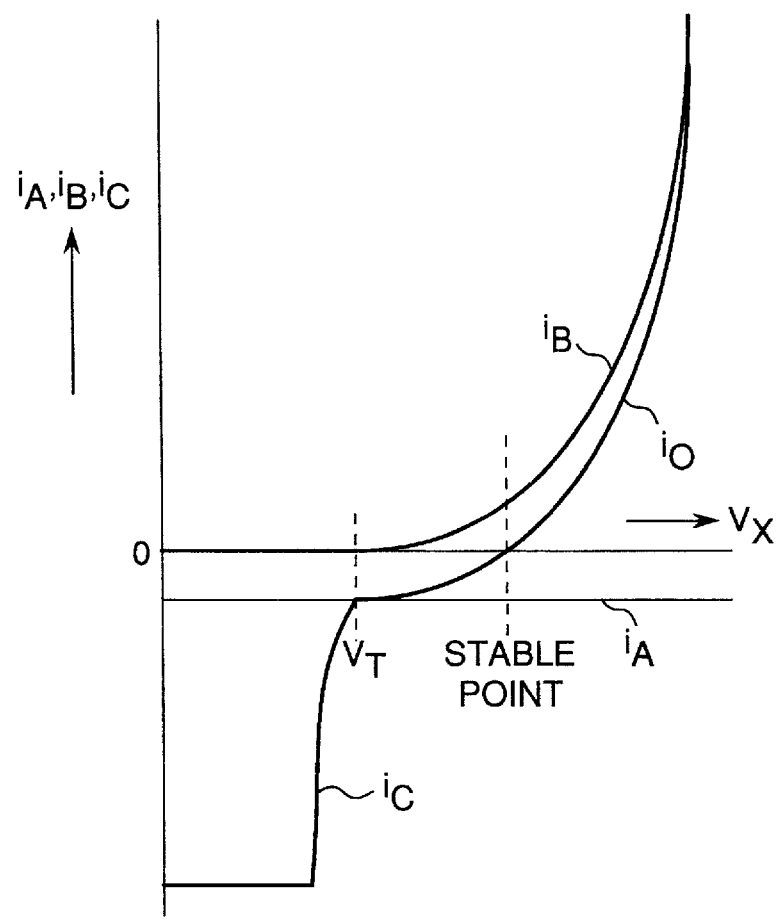

DIFFERENTIAL AMPLIFIER CIRCUIT WITH A HIGH THROUGH PUT RATE AND REDUCED POWER CONSUMPTION

BACKGROUND OF THE INVENTION

1. Field of the Invention

The present invention relates to a differential amplifier used in, for example, a capacitive digital/analog (D/A) converter built in to a liquid crystal (LC) driver for driving a TFT-matrix color LCD panel and converting digital color image signals to analog voltage signals. When this type of differential amplifier is integrated, plural devices are arrayed in series on a single semiconductor substrate according to the columns of the TFT-matrix color LCD panel.

2. Description of the Prior Art

A differential amplifier according to the prior art comprises a differential circuit 1 and output circuit 2 as shown in FIG. 12. The differential circuit 1 connects the source of a p-channel MOS transistor 11 to the power supply $V_{DD}$, supplies a constant bias voltage $V_{bias}$ to the gate of the p-channel MOS transistor 11, and thus causes the p-channel MOS transistor 11 to function as a constant current supply.

The sources of two other p-channel MOS transistors 12 and 13 are commonly connected to the drain of the p-channel MOS transistor 11. The drain of an n-channel MOS transistor 14 is connected to the drain of the one p-channel MOS transistor 12, and the drain of another n-channel MOS transistor 15 is connected to the drain of the other p-channel MOS transistor 13.

The sources of n-channel MOS transistors 14 and 15 are commonly connected to the ground, and the gates of n-channel MOS transistors 14 and 15 are commonly connected to the drain of p-channel MOS transistor 13, i.e., to the drain of n-channel MOS transistor 15.

The output circuit 2 connects a source of the constant current source transistor 21, which is a p-channel MOS transistor, to the power supply $V_{DD}$, and supplies a constant bias voltage $V_{bias}$ to the gate of the constant current source transistor 21. The drain of a control transistor 22, which is an n-channel MOS transistor, is connected to the drain of the constant current source transistor 21, the source is grounded, and the gate is connected to the drain of the p-channel MOS transistor 12, which is the output terminal of the differential circuit 1.

A non-inverting input terminal 16 is also disposed to the gate of the p-channel MOS transistor 12, an inverting input terminal 17 is disposed to the gate of the p-channel MOS transistor 13, and an output terminal 23 is disposed to the contact between the constant current source transistor 21 and control transistor 22 (i.e., to their common drain).

The operation of a differential amplifier thus comprised is described next.

The differential circuit 1 of this differential amplifier outputs output voltage $V_x$ based on the difference between the voltage V+ applied to the non-inverting input terminal 16 and the voltage V− applied to the inverting input terminal 17. The constant current source transistor 21 of the output circuit 2 outputs a constant current (discharge current) $i_A$, which flows either to the output terminal 23 or passes through the control transistor 22 as a through-current. The current $i_B$ (pull-in current) flowing to the control transistor 22 varies according to the output voltage $V_x$ of the differential circuit 1, and is the sum of the current $i_A$ (through current) passing through the constant current source transistor 21, and the current $i_O$ flowing from the output terminal 23. As a result, the current $i_O$ from the output terminal 23 (or the current $-i_O$ flowing to the output terminal 23) can be controlled by controlling the current $i_B$ flowing to the control transistor 22.

When this differential amplifier is operating, a capacitive load (not shown in the figure) is connected to the output terminal 23, the voltage $V_O$ of the output terminal 23 is fed directly to the inverting input terminal 17, or is fed back through a feedback capacitance. If it is assumed that there is no leakage current in the capacitive load, the absolute value of the current $i_A$ flowing from the constant current source transistor 21, and the absolute value of the current $i_B$ flowing to the control transistor 22, will be equal, and will be stable when the current $i_O$ from the output terminal 23, or the current $-i_O$ flowing to the output terminal 23, is zero. This state is referenced below as the steady state.

The output voltage $V_x$ of the differential circuit 1 also changes each time the voltage V+ applied to the non-inverting input terminal 16 and the voltage V− applied to the inverting input terminal 17 change. This causes the current $i_B$ flowing to the control transistor 22 to change, charging the capacitive load connected to the output terminal 23 by supplying all or part of the current $i_A$ from the constant current source transistor 21 to the output terminal 23, and thereby increasing the voltage $V_O$ of the output terminal 23, or discharging the capacitive load connected to the output terminal 23 by supplying current from the output terminal 23 through the control transistor 22, and thereby lowering the voltage $V_O$ of the output terminal 23. A steady state is resumed when the output voltage $V_x$ of the differential circuit 1 returns to the original (steady state) voltage as a result of the increase or decrease in voltage $V_O$.

The relationship between the output voltage $V_x$ of the differential circuit 1 and the currents $i_A$ and $i_B$ flowing to the output circuit 2, is shown in FIG. 13. Current $i_B$ increases as the differential circuit output voltage $V_x$ increases, and becomes the pull-in current causing current from the output terminal 23 to flow to the contact between the constant current source transistor 21 and the control transistor 22. The area of current $i_B$ shown in FIG. 13 is therefore in the positive polarity region.

Current $i_A$ is constant irrespective of the differential circuit output voltage $V_x$, and becomes the discharge current flowing from the common contact of constant current source transistor 21 and control transistor 22 to the output terminal 23. Current $i_A$ is therefore shown within the negative polarity region in FIG. 13.

When the output voltage $V_x$ of the differential circuit 1 is low, current $i_B$ is zero or a very nominal current level, and current $i_A$ is greater than current $i_B$. The difference current of currents $i_A$ and $i_B$ thus flows from the common contact of constant current source transistor 21 and control transistor 22 to the output terminal 23, thereby charging the capacitive load connected to the output terminal 23, and increasing the voltage of the output terminal 23.

When the output voltage $V_x$ of the differential circuit 1 is high, a large current $i_B$ flows, and this current $i_B$ therefore exceeds the level of current $i_A$. Thus, the difference current of currents $i_A$ and $i_B$ causes the current from the output terminal 23 to flow to the common contact of constant current source transistor 21 and control transistor 22, thereby discharging the capacitive load connected to the output terminal 23, and dropping the voltage of the output terminal 23.

This differential amplifier thus stabilizes at the point (the stabilization point) where the absolute values of currents $i_A$ and $i_B$ become equal because of the negative feedback applied during operation.

The operation of the differential amplifier shown in FIG. 12 is described in further detail below referring to the timing chart shown in FIG. 14 for the operation when the output terminal 23 is connected to the inverting input terminal 17, and the output voltage $V_O$ of the output terminal 23 is fed directly back to the inverting input terminal 17 ($V^- = V_O$).

As shown in FIG. 14(A), the voltage $V_+$ of the non-inverting input terminal 16 is assumed to change in the square wave pattern $V_A \rightarrow V_B \rightarrow V_A$ (where $V_A > V_B$). When voltage $V^+$ drops ($V_A \rightarrow V_B$), differential circuit output voltage $V_x$ rises suddenly to output voltage $V_{x1}$ from output voltage $V_{x0}$, the stabilization point where the absolute values of currents $i_A$ and $i_B$ are equal, as shown in FIG. 14(C). As a result, the current $i_B$ of control transistor 22 rises suddenly from the stabilization point current $i_{B0}$ to current $i_{B1}$ as shown in FIG. 14(D), causing the capacitive load to be rapidly discharged, and output voltage $V_O$ to drop sharply from voltage $V_{O1}$ to voltage $V_{O2}$ as shown in FIG. 14 (B). As output voltage $V_O$ approaches voltage $V_{O2}$, output voltage $V_x$ drops, current $i_B$ decreases, voltage $V_O$ becomes voltage $V_{O2}$ current $i_B$ becomes current $i_{B0}$ and the steady state is restored.

When voltage $V^+$ rises ($V_B \rightarrow V_A$) as shown in FIG. 14(A), differential circuit output voltage $V_x$ drops rapidly, as shown in FIG. 14(C), to zero from the stabilization point output voltage $V_{x0}$ where the absolute values of currents $i_A$ and $i_B$ are equal. As a result, the current $i_B$ of control transistor 22 decreases from the stabilization point current $i_{B0}$ to zero, causing the capacitive load to be gradually charged by the current $i_A$ of the constant current source transistor 21. The output voltage $V_O$ thus rises gradually from voltage $V_{O2}$ to voltage $V_{O1}$ as shown in FIG. 14(B). When the output voltage $V_O$ rises to nearly voltage $V_{O1}$, and current $i_B$ rises to current $i_{B0}$, the steady state is again restored.

The output terminal voltage $V_O$ drops quickly and rises slowly because while the current capacity of the control transistor 22 is high, the current $i_A$ of the constant current source transistor 21 is held low, and the through current flowing through the constant current source transistor 21 and control transistor 22 in the steady state is held low to minimize power consumption.

To achieve a high current capacity in the control transistor 22 while minimizing power consumption in the conventional differential amplifier thus described, the through current flowing through the constant current source transistor 21 and control transistor 22 in the steady state is reduced, i.e., the current $i_A$ of the constant current source transistor 21 is minimized. As a result, the output voltage $V_O$ of the output terminal 23 drops relatively fast, but cannot be raised quickly because the current $i_A$ of the constant current source transistor 21 is low, and the throughput rate is therefore low.

If the objective is a high throughput rate, however, a high current $i_A$ is required in the constant current source transistor 21. This increases the through current passing through the constant current source transistor 21 and control transistor 22 in the steady state, and increases power consumption.

SUMMARY OF THE INVENTION

Therefore, an object of the present invention is to provide a differential amplifier achieving a high throughput rate while also achieving low power consumption.

To achieve this object, a differential amplifier according to the present invention comprises: a differential circuit comprising a non-inverting input and an inverting input for outputting a difference voltage relative to a difference between a voltage applied to the non-inverting input and a voltage applied to the inverting input; an output circuit comprising a constant current supply transistor for supplying a constant current, and a control transistor controlled by the difference voltage, and a junction between the supply transistor and the control transistor; a drive transistor connected to the junction for supplying current in to the junction; and a switching circuit for supplying a drive signal to the drive transistor to enable the drive transistor when the difference voltage is below (or "above" in a different embodiment) a predetermined threshold voltage, and to disable the drive transistor when the difference voltage is above (or "below" in a different embodiment) the predetermined threshold voltage.

According to the present invention, the drive transistor is provided in parallel with the constant current supply transistor of the output circuit, a switching circuit to which is input the output voltage of the differential circuit is provided, and current is supplied to the drive transistor only when the differential circuit output voltage is sufficiently low and current is either not flowing or is flowing at a sufficiently low level to the control transistor. It is therefore possible to supply a sufficiently high current level from the drive transistor to the output terminal, accelerate the voltage rise of the output terminal, and cut off the drive transistor in the steady state, even when the current flowing to the constant current supply transistor is set low, and the through current flowing to the constant supply transistor and the control transistor in the steady state are thereby reduced.

BRIEF DESCRIPTION OF THE DRAWINGS

The present invention will become more fully understood from the detailed description given below and the accompanying diagrams wherein:

FIG. 2 is a graph of the relationship between differential circuit output and the output current of the output circuit in the differential amplifier of FIG. 1;

DESCRIPTION OF PREFERRED EMBODIMENTS

The preferred embodiments of a differential amplifier according to the present invention are described hereinbelow with reference to the accompanying figures.

Embodiment 1

Figure 1:
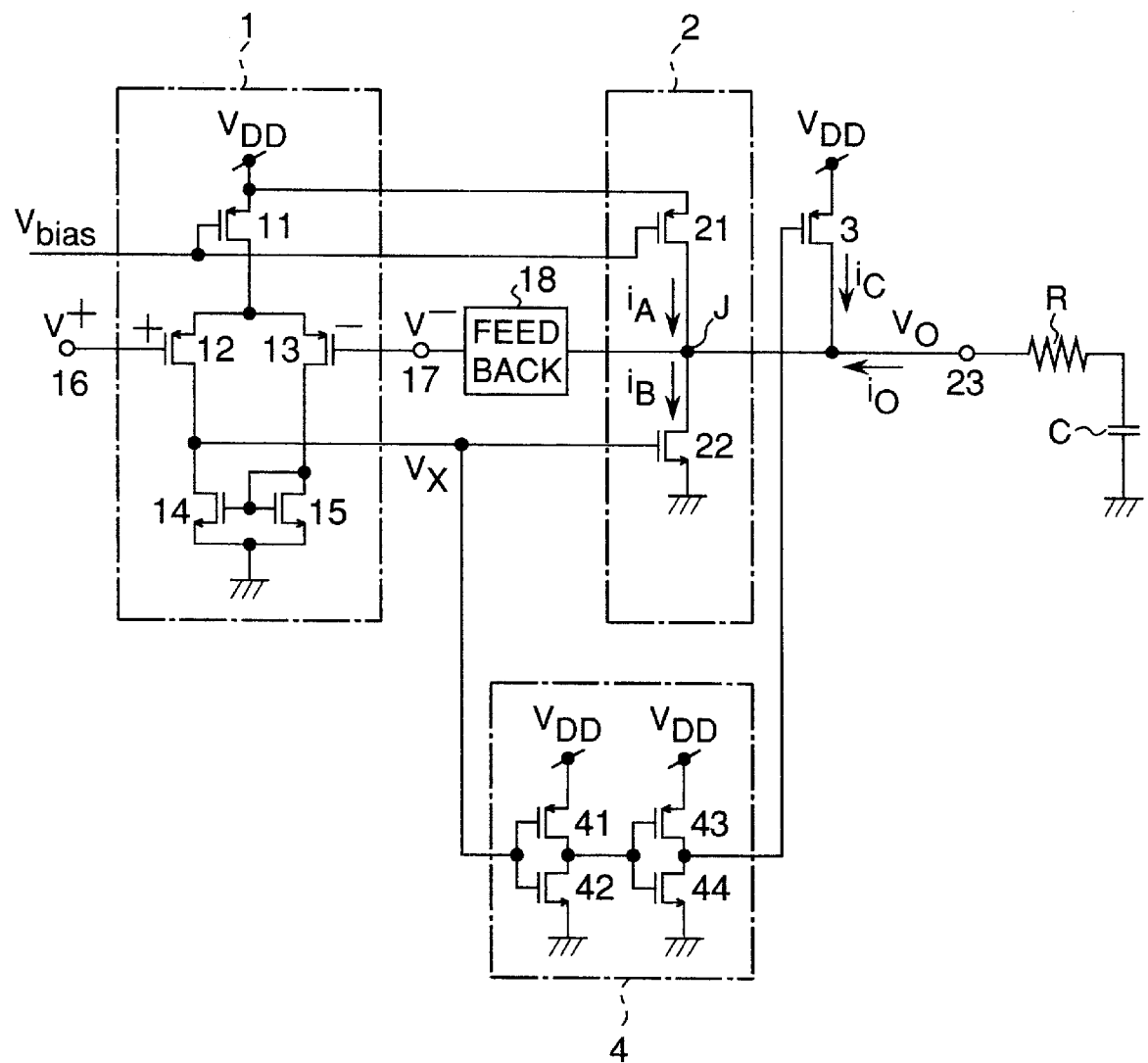
FIG. 1 is a circuit diagram of a differential amplifier according to the first embodiment of the present invention.

FIG. 1 is a circuit diagram of a differential amplifier according to the first embodiment of the invention. As shown in FIG. 1, this differential amplifier comprises a differential circuit 1, output circuit 2, a drive transistor 3, and a switching circuit 4. Note that the drive transistor 3 is a p-channel MOS transistor, and the switching circuit 4 controls the current supply to the drive transistor 3, i.e., supplying current and interrupting the current supply to the drive transistor 3.

Figure 12:
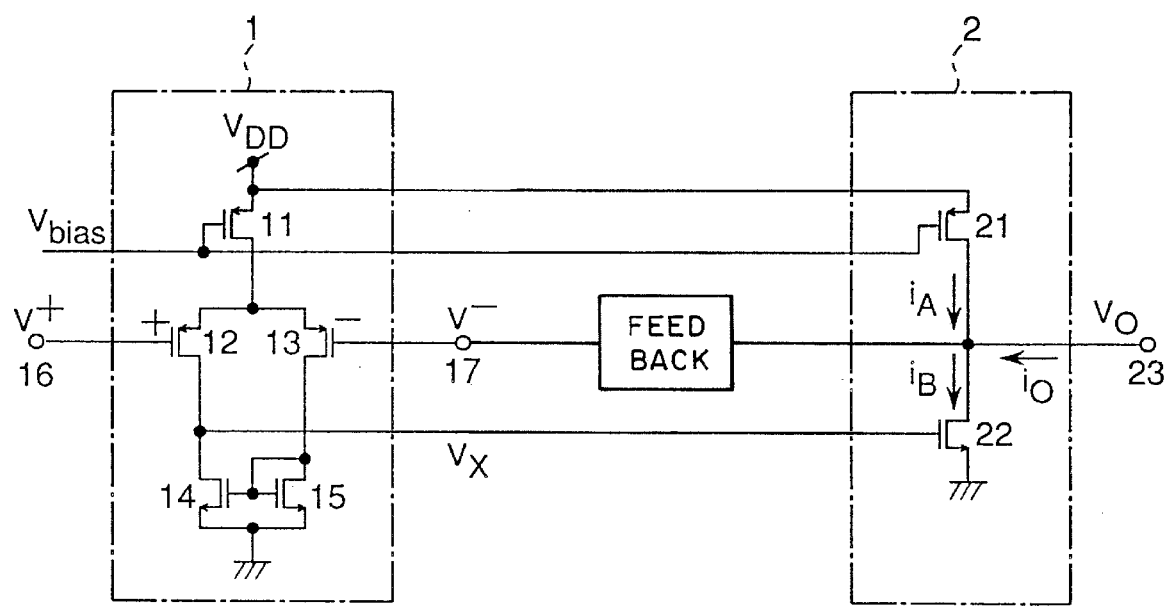
FIG. 12 is a circuit diagram used to describe a differential amplifier according to the prior art.
Figure 13:
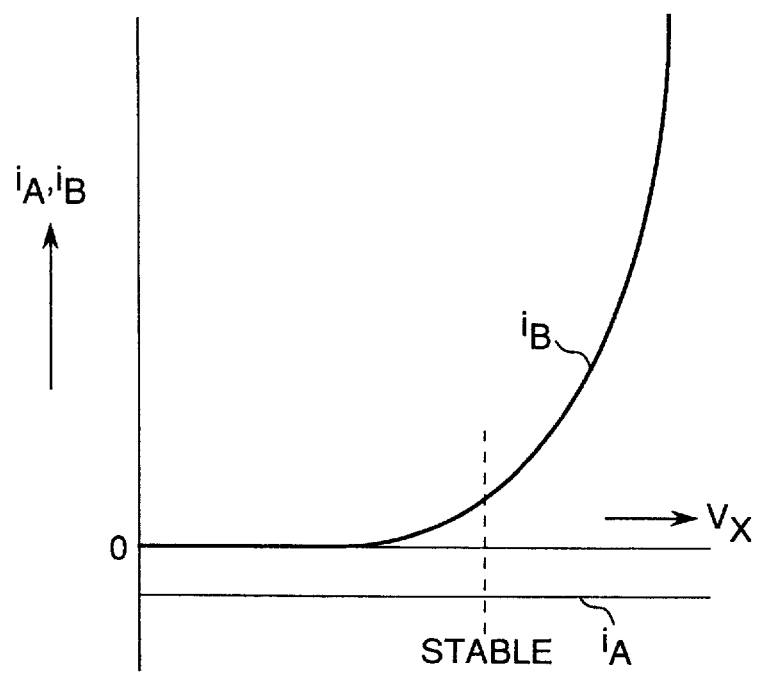
FIG. 13 is a graph of the relationship between differential circuit output and the output current of the output circuit in the differential amplifier of FIG. 12.
Figures 14A, 14B, 14C, 14D:
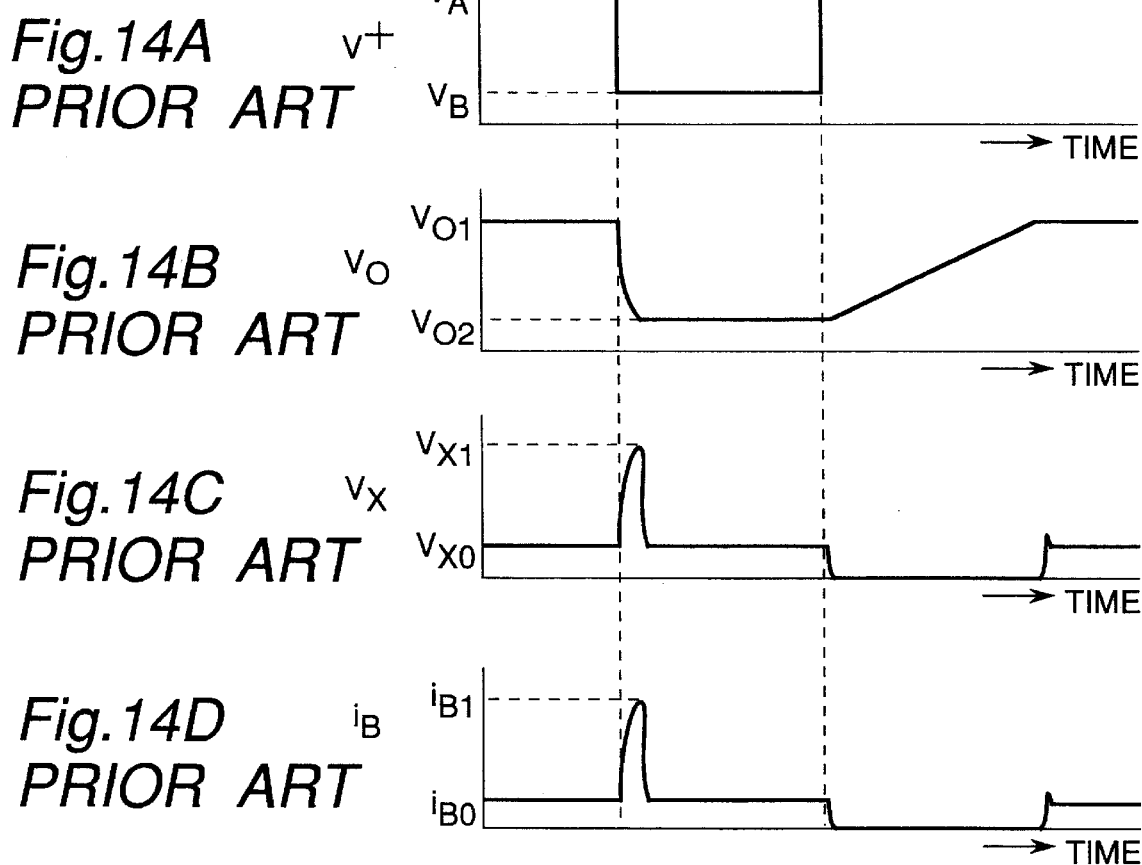
FIGS. 14A, 14B, 14C and 14D are wave forms to describe the operation of the differential amplifier of FIG. 12.

The differential circuit 1 is identical to the differential circuit 1 shown in FIG. 12, supplying the power supply $V_{DD}$ to the source, and a constant bias voltage $V_{bias}$ to the gate of the p-channel MOS transistor 11, and thus causing the p-channel MOS transistor 11 to function as a constant current supply.

The sources of two p-channel MOS transistors 12 and 13 are commonly connected to the drain of the p-channel MOS transistor 11. The drain of an n-channel MOS transistor 14 is connected to the drain of p-channel MOS transistor 12, and the drain of another n-channel MOS transistor 15 is connected to the drain of the other p-channel MOS transistor 13.

The sources of the n-channel MOS transistors 14 and 15 are commonly connected to the ground, and the gates thereof are commonly connected to the drain of p-channel MOS transistor 13, i.e., to the drain of the one n-channel MOS transistor 15.

The output circuit 2 is likewise similar to that shown in FIG. 12. The source of the constant current source transistor 21, which is a p-channel MOS transistor, is connected to the power supply $V_{DD}$, and a constant bias voltage $V_{bias}$ is supplied to the gate thereof. The drain of the control transistor 22, which is an n-channel MOS transistor, is connected to the drain of the constant current source transistor 21, the source is grounded, and the gate is connected to the drain of the p-channel MOS transistor 12, which is the output terminal of the differential circuit 1.

The source of the drive transistor 3 is connected to the power supply $V_{DD}$, and the drain is connected to a contact between the constant current source transistor (p-channel MOS transistor) 21 and the control transistor (n-channel MOS transistor) 22. Thus, the drive transistor 3 is disposed in parallel with the constant current source transistor 21, and drives current in the same direction as the constant current source transistor 21.

The switching circuit 4 comprises, for example, two pairs of series circuits forming two inverter circuits connected in series. The one series circuit comprising a p-channel MOS transistor 41 and an n-channel MOS transistor 42, and the other series circuit comprising a p-channel MOS transistor 43 and an n-channel MOS transistor 44. In particular, the p-channel MOS transistor 41 and n-channel MOS transistor 42 forming the first-stage inverter have a low threshold voltage setting, determined by the pattern design during circuit integration, and function to supply a drive signal and thus current to the drive transistor 3 when the output voltage $V_x$ of the differential circuit 1 is below a particular threshold voltage, and to stop supplying the drive signal, and thus shut off the drive transistor 3, when said output voltage $V_x$ is greater than the particular threshold voltage. Thus, the switching circuit 4 operates such that when the input voltage $V_x$ thereto becomes less than a predetermined threshold voltage $V_T$ (FIG. 3F), switching circuit 4 produces a low level signal, and when the input voltage $V_x$ thereto becomes greater than the threshold voltage $V_T$, switching circuit 4 produces a high level signal.

A non-inverting input terminal 16 is disposed to the gate of the p-channel MOS transistor 12, an inverting input terminal 17 is disposed to the gate of the other p-channel MOS transistor 13. An output terminal 23 is connected to a junction J (common drain point) between the constant current source transistor 21 and control transistor 22. Junction J is further connected through a feedback circuit 18 to the inverting input terminal 17. The feedback circuit 18 can be a simple short circuit, or can be a CR circuit, or any other type of feedback circuit. The output terminal 23 is connected through a resistor R to a capacitive load C.

The operation of the differential amplifier thus comprised is described below.

The differential circuit 1 of this differential amplifier outputs voltage $V_x$ (FIG. 3C) based on the difference between the voltage V+ (FIG. 3A) applied to the non-inverting input terminal 16 and the voltage V− (FIG. 3E) applied to the inverting input terminal 17. The constant current source transistor 21 of the output circuit 2 outputs a constant current (discharge current) $i_A$, which flows either to the output terminal 23 or passes through the control transistor 22 as a through-current.

The current $i_B$ (pull-in current) (FIG. 3E) flowing to the control transistor 22 varies according to the output voltage $V_x$ of the differential circuit 1, and is the sum of the current $i_A$ (through current) passing through the constant current source transistor 21, and the current $i_O$ flowing from the output terminal 23. As a result, the current $i_O$ from the output terminal 23 (or the current $-i_O$ flowing to the output terminal 23) can be controlled by controlling the current $i_B$ flowing to the control transistor 22.

When the output voltage $V_x$ of the differential circuit 1 is sufficiently low and becomes less than a threshold voltage $V_T$ (time t3 in FIG. 3F or 3C), and current $i_B$ is less than current $i_A$ the switching circuit 4 produces a low level drive signal to the drive transistor 3. Thus, at time t3, transistor 3 turns on to permit the current $i_c$ (FIG. 3D or 3G) flow through the drive transistor 3 to the output terminal 23. Thus, current $i_c$ added to current $i_A$ is used for charging the capacitive load C connected to the output terminal 23. This results in faster charging of the capacitive load C than that shown in FIG. 12, i.e., than the charging when only current $i_A$ flows to the output terminal 23, thus causing the voltage $V_O$ (FIG. 3B) of the output terminal 23 to rise rapidly. The voltage charged in the capacitive load C is applied through the feedback circuit 18 to terminal 17.

When the voltage $V_O$ (≈V−) increases so that the difference between the voltages V+ and V−, i.e., the voltage $V_x$ becomes great so that current $i_B$ of the control transistor 22 begins flowing. Also, when the voltage $V_x$ becomes greater than the threshold voltage $V_T$ (time t4 in FIG. 3F or 3C), the switching circuit 4 produces a high level drive signal to the drive transistor 3. Thus, at time t4, transistor 3 turns off to cut off the current $i_c$ (FIG. 3D or 3G), thus preventing a through-current from flowing from the drive transistor 3 to the control transistor 22.

When this differential amplifier is operating, the capacitive load C is connected to the output terminal 23, the voltage $V_O$ of the output terminal 23 is fed back directly or through the feedback circuit 18 to the inverting input terminal 17. If it is assumed that there is no leakage current in the capacitive load C, the absolute value of the current $i_A$ flowing from the constant current source transistor 21, and the absolute value of the current $i_B$ flowing to the control transistor 22, will be equal, and will be stable (stable point in FIG. 2) when the current $i_O$ from the output terminal 23, or the current $-i_O$ flowing to the output terminal 23, is zero.

The output voltage $V_x$ of the differential circuit 1 also changes each time the voltage V+ applied to the non-inverting input terminal 16 and the voltage V− applied to the inverting input terminal 17 change, thus changing the current $i_B$ flowing to the control transistor 22 and the current $i_c$ flowing from the switching circuit 4 to the drive transistor 3.

By thus controlling the levels of currents $i_B$ and $i_c$, and supplying all or part of current $i_c$ from the drive transistor 3 and current $i_A$ from the constant current source transistor 21 to the output terminal 23, the capacitive load C connected to the output terminal 23 can be charged and the voltage $V_O$ of the output terminal 23 increased, or current can be pumped from the output terminal 23 through the control transistor 22 to discharge the capacitive load C connected to the output terminal 23, and thus drop the voltage $V_O$ of the output terminal 23. A steady state can thus be resumed by raising or lowering the voltage $V_O$ to return the output voltage $V_x$ of the differential circuit 1 to the original (steady state) level.

The relationship between the output voltage $V_x$ of the differential circuit 1, the currents $i_A$ and $i_B$ flowing from the output circuit 2, and the current $i_c$ flowing to the drive transistor 3, is shown in FIG. 2. Current $i_B$ increases as the differential circuit output voltage $V_x$ increases, and becomes the pull-in current causing current from the output terminal 23 to flow to the junction J between the constant current source transistor 21 and the control transistor 22. The area of current $i_B$ shown in FIG. 2 is therefore in the positive polarity region.

Current $i_A$ is constant irrespective of the differential circuit output voltage $V_x$, and becomes the discharge current flowing from the junction J of constant current source transistor 21 and control transistor 22 to the output terminal 23. Current $i_A$ is therefore shown within the negative polarity region in FIG. 2.

Current $i_c$ flows only within the region where the output voltage $V_x$ of the differential circuit 1 is lower than threshold voltage $V_T$, where $V_T$ is the threshold voltage of the switching circuit 4, and is thus the discharge current flowing to the output terminal 23 and shown in the negative polarity region in FIG. 2.

This threshold voltage $V_T$ is set lower than the output voltage $V_x$ of the differential circuit 1 when current $i_B$ starts flowing to the control transistor 22 to prevent a through-current flowing from the drive transistor 3 to the control transistor 22, i.e., to prevent current $i_B$ of the control transistor 22 and current $i_c$ of the drive transistor 3 (which flow relative to the output terminal 23 in opposite directions) from flowing at the same time, and thereby prevent an increase in power consumption. If threshold voltage $V_T$ is set lower than the output voltage $V_x$ of the differential circuit 1 when the absolute values of the current $i_B$ flowing to the control transistor 22 and the current $i_A$ flowing from the constant current source transistor 21 are equal, the steady state through-current is the same as in the prior art.

When the output voltage $V_x$ of the differential circuit 1 is low, current $i_B$ does not flow or flows at an extremely low level, current $i_A$ is stronger than current $i_B$, and current $i_c$ flows. The difference current of currents $i_A$ and $i_B$ therefore flows from the contact between constant current source transistor 21 and control transistor 22 to the output terminal 23, and current $i_c$ flows from the drive transistor 3 to the output terminal 23. The capacitive load connected to the output terminal 23 is therefore rapidly charged, and the voltage of the output terminal 23 rises rapidly.

When the output voltage $V_x$ of the differential circuit 1 is high, current $i_c$ becomes zero, and current $i_B$ flows at a high level exceeding current $i_A$. The difference current of currents $i_A$ and $i_B$ therefore flows from the output terminal 23 to the contact between constant current source transistor 21 and control transistor 22, discharging the capacitive load C connected to the output terminal 23, and rapidly dropping the output terminal voltage.

This differential amplifier thus stabilizes at the point (the stable point) where the absolute values of currents $i_A$ and $i_B$ become equal because of the negative feedback applied during operation.

Figure 3A:
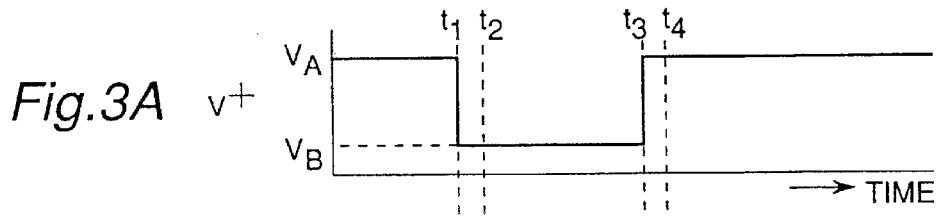
FIGS. 3A, 3B, 3C, 3D, 3E, 3F and 3G are graphs showing wave forms to describe the operation of the differential amplifier of FIG. 1
Figure 3B:
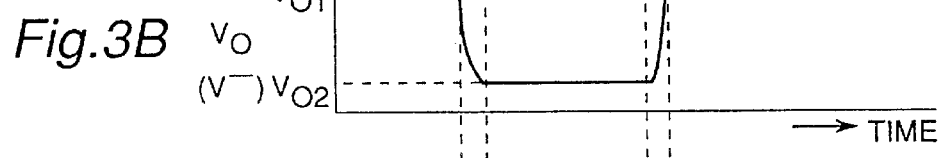
Figure 3C:
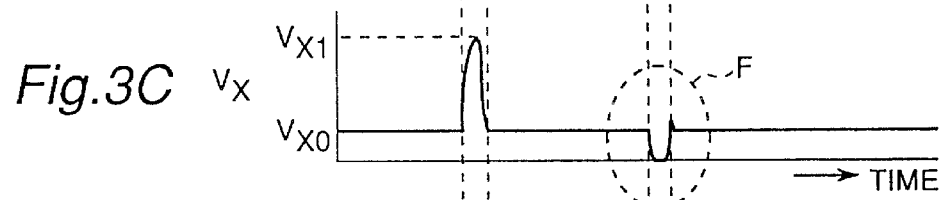
Figure 3D:
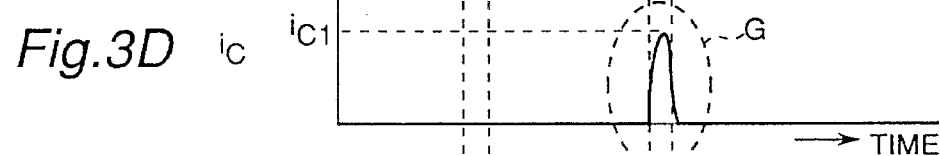
Figure 3E:
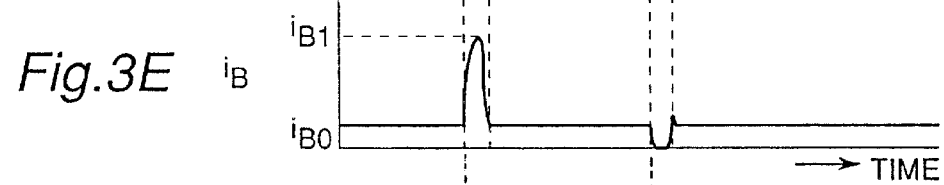
Figure 3H:
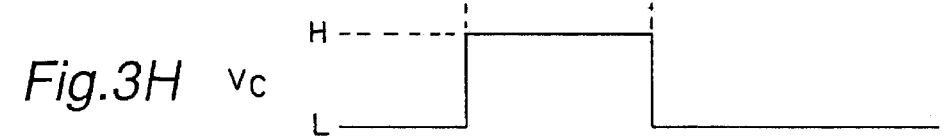
FIG. 3H is a graph showing a wave form to describe the operation of the differential amplifier of FIG. 9.
Figure 3F:
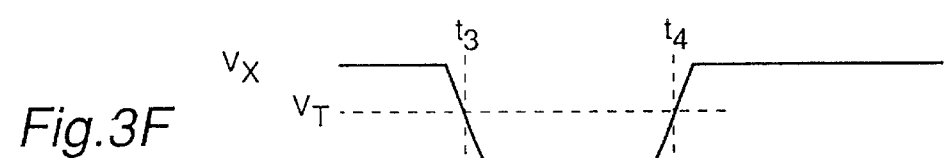
Figure 3G:
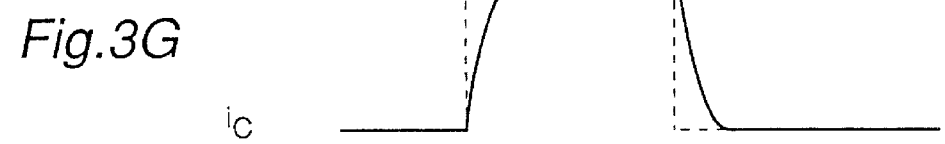

The operation of the differential amplifier shown in FIG. 1 is described in further detail below referring to the timing chart shown in FIGS. 3A–3G in which FIGS. 3F and 3G are shown in enlarged scale of portions F and G shown in FIGS. 3C and 3D, respectively. In operation, it is assumed that the feedback circuit 18 makes a direct connection between the output terminal 23 and the inverting input terminal 17, so that the output voltage $V_O$ of the output terminal 23 is fed directly back to the inverting input terminal 17 ($V^-=V_O$).

As shown in FIG. 3A, the voltage $V^+$ of the non-inverting input terminal 16 is assumed to change in the square wave pattern $V_A \rightarrow V_B \rightarrow V_A$ (where $V_A > V_B$) When voltage $V_+$ drops ($V_A \rightarrow V_B$) differential circuit output voltage $V_x$ rises suddenly to output voltage $V_{x1}$ from output voltage $V_{xO}$, the output voltage at the stabilization point where the absolute values of currents $i_A$ and $i_B$ are equal, as shown in FIG. 3C. As a result, the current $i_B$ of control transistor 22 rises suddenly from the stabilization point current $i_{B0}$ to current $i_{B1}$ as shown in FIG. 3E, causing the capacitive load to be rapidly discharged, and output voltage $V_O$ to drop sharply from voltage $V_{O1}$ to voltage $V_{O2}$ as shown in FIG. 3B. As output voltage $V_O$ approaches voltage $V_{O2}$ output voltage $V_x$ drops, current $i_B$ decreases, voltage $V_O$ becomes voltage $V_{O2}$, current $i_B$ becomes current $i_{B0}$, and the steady state is entered.

When voltage $V^+$ rises ($V_B \rightarrow V_A$) as shown in FIG. 3A, differential circuit output voltage $V_x$ drops rapidly, as shown in FIG. 3C, to zero from the stabilization point output voltage $V_{x0}$ where the absolute values of currents $i_A$ and $i_B$ are equal. As a result, the current $i_B$ of control transistor 22 decreases from the stabilization point current $i_{B0}$ to zero, as shown in FIG. 3E, current $i_A$ of the constant current source transistor 21 flows to the output terminal 23, and the current $i_c$ flowing through the drive transistor 3 rises rapidly to current $i_{c1}$ as shown in FIG. 3D (though the polarity is actually opposite that shown). This current $i_{c1}$ is thus output from the drive transistor 3 to the output terminal 23, rapidly charging the capacitive load and thus rapidly raising the output voltage $V_O$ from voltage $V_{O2}$ to voltage $V_{O1}$ as shown in FIG. 3B. The steady state is again restored when the output voltage $V_O$ rises to essentially voltage $V_{O1}$, current $i_c$ returns to zero, and current $i_B$ returns to current $i_{B0}$.

The differential amplifier according to the first embodiment of the invention described above thus disposes a drive transistor 3 in parallel with the constant current source transistor 21 of the output circuit 2, and a switching circuit 4 to which the output voltage $V_x$ of the differential circuit 1 is input, and which supplies current to the drive transistor 3 only when the output voltage $V_x$ of the differential circuit 1 is sufficiently low and current is not flowing to the control transistor 22. It is therefore possible to supply a sufficiently high current level from the drive transistor 3 to the output terminal 23, accelerate the voltage rise of the output terminal, and cut off the drive transistor 3 in the steady state, even when the current flowing to the constant current supply transistor 21 is set low, and the through current flowing to the constant current supply transistor 21 and the control transistor 22 in the steady state are reduced. A high throughput rate can therefore be achieved, and power consumption reduced. Because current $i_B$ of the control transistor 22 and current $i_c$ of the drive transistor 3 also do not flow at the same time (wasteful through-current), power consumption can be further reduced.

Embodiment 2

Figure 4:
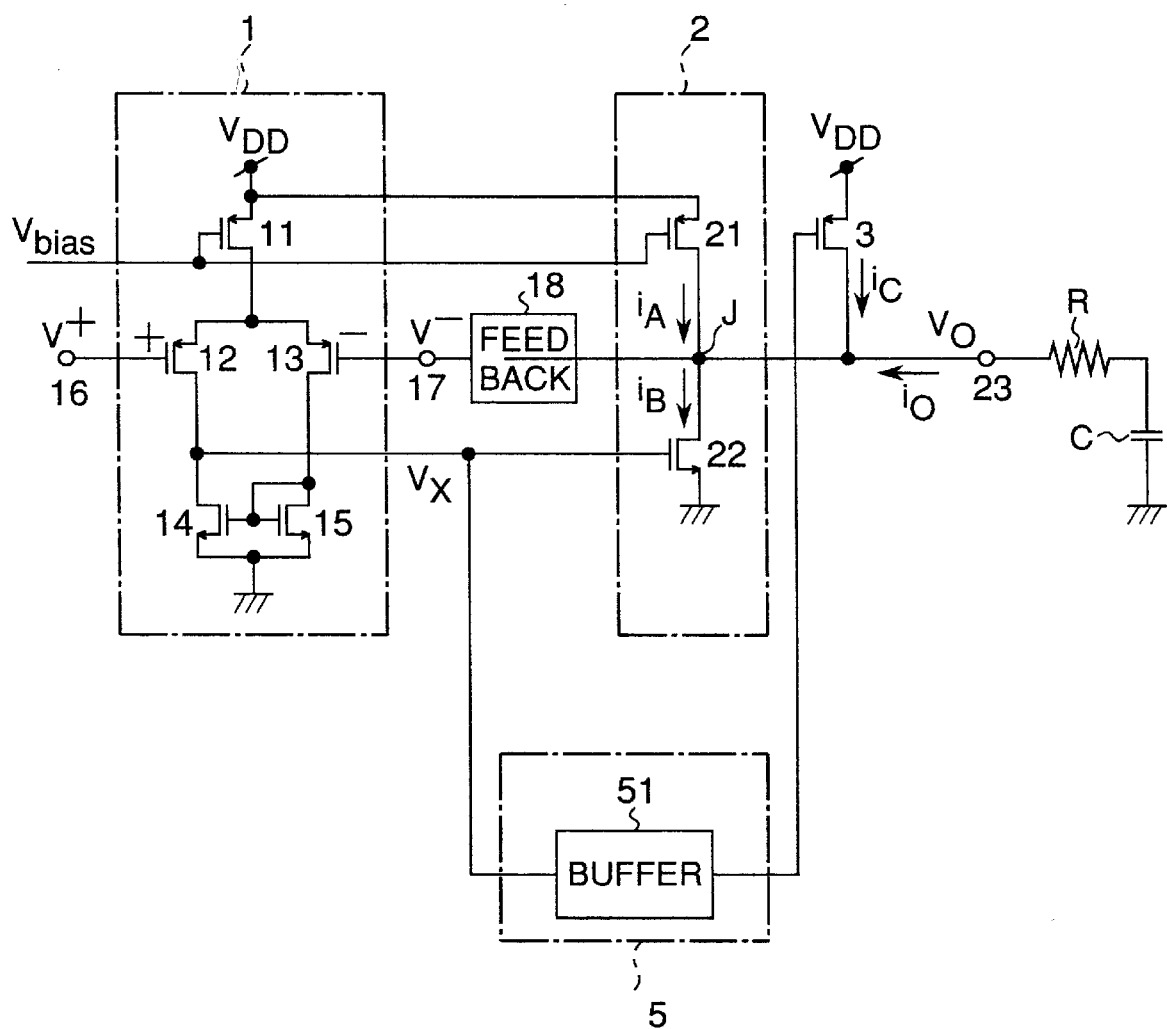
FIG. 4 is a circuit diagram of a differential amplifier according to the second embodiment of the present invention.

A differential amplifier according to the second embodiment of the present invention is shown in FIG. 4. This differential amplifier uses a switching circuit 5 as shown in FIG. 4 for the switching circuit 4 shown in FIG. 1. This switching circuit 5 differs from switching circuit 4 in using a buffer circuit 51 in place of the two-stage inverter shown in FIG. 1. When the output voltage $V_x$ of the differential circuit 1 is lower than a threshold voltage $V_T$, the switching circuit 5 supplies a low level drive signal to the drive transistor 3 to drive current $i_c$; when the output voltage $V_x$ of the differential circuit 1 exceeds said threshold voltage $V_T$, the switching circuit 5 supplies a high level signal to the drive transistor 3, and thus shuts off the drive transistor 3. Note that the buffer circuit 51 may be of any construction whereby the output state inverts at the edge of the threshold voltage $V_T$ as described above.

Figure 5:
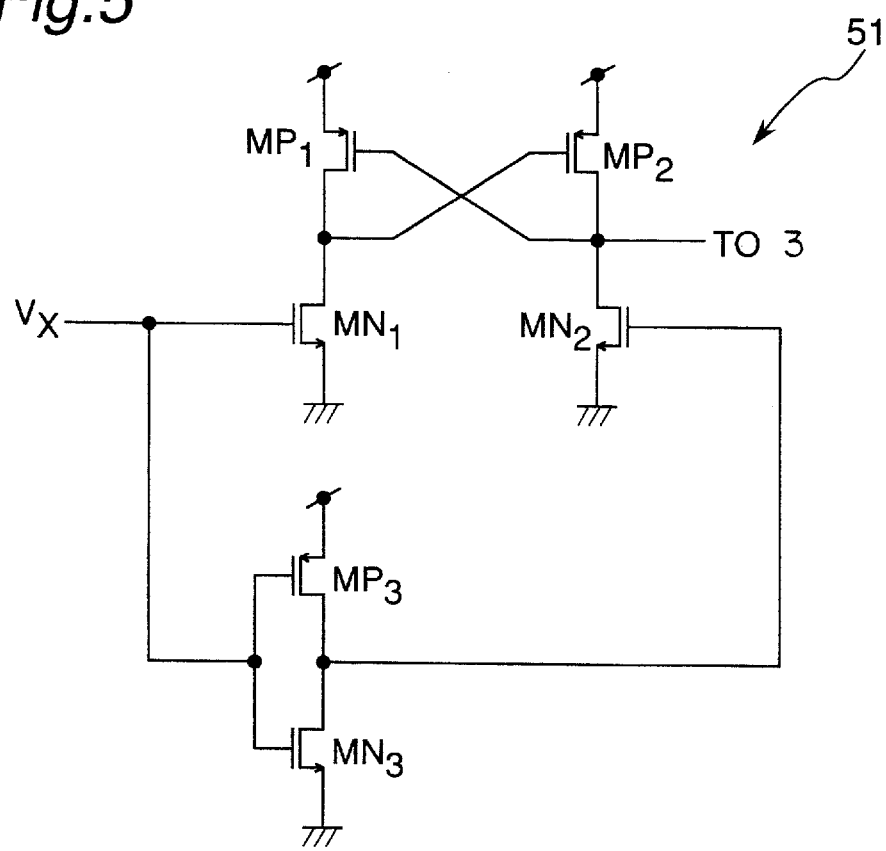
FIG. 5 is a circuit diagram of the buffer circuit shown in FIG. 4.

One preferred embodiment of the buffer circuit 51 is described next with reference to FIG. 5. This buffer circuit 51 is, for example, a level shift circuit, which is a voltage conversion circuit for connecting two circuits of different power supply voltages. As shown in FIG. 5, the buffer circuit 51 comprises three p-channel MOS transistors MP1, MP2, MP3, and three n-channel MOS transistors MN1, MN2, MN3 with p-channel MOS transistor MP1 and n-channel MOS transistor MN1 connected in series, p-channel MOS transistor MP2 and n-channel MOS transistor MN2 connected in series, and p-channel MOS transistor MP3 and n-channel MOS transistor MN3 connected in series.

The common drain of p-channel MOS transistor MP1 and n-channel MOS transistor MN1 is connected to the gate of p-channel MOS transistor MP2. The common drain of p-channel MOS transistor MP2 and n-channel MOS transistor MN2 is connected to the gate of the first p-channel MOS transistor MP1, and to the gate of the drive transistor 3. The output terminal of the differential circuit 1 is connected to the gate of the n-channel MOS transistor MN1, and to the common gate of p-channel MOS transistor MP3 and n-channel MOS transistor MN3, and the common drain of p-channel MOS transistor MP3 and n-channel MOS transistor MN3 is connected to the gate of n-channel MOS transistor MN2.

When the output voltage $V_x$ of the differential circuit 1 is HIGH in FIG. 5, the first n-channel MOS transistor MN1 becomes on, and the second n-channel MOS transistor MN2 becomes off. When n-channel MOS transistor MN1 is on, the gate voltage of p-channel MOS transistor MP2 drops, the p-channel MOS transistor MP2 becomes on, and p-channel MOS transistor MP1 becomes off. A HIGH gate voltage is thus applied to the drive transistor 3.

When the output voltage $V_x$ of the differential circuit 1 is LOW, the first n-channel MOS transistor MN1 becomes off, and the second n-channel MOS transistor MN2 becomes on. When n-channel MOS transistor MN2 is on, the gate voltage of p-channel MOS transistor MP1 drops, the p-channel MOS transistor MP1 becomes on, and p-channel MOS transistor MP2 becomes off. A LOW gate voltage is thus applied to the drive transistor 3.

Note that by appropriately setting the sizes of the p-channel MOS transistors MP1–MP3 and n-channel MOS transistors MN1–MN3, the output voltage $V_x$ can be set low, and the gate voltage applied to the drive transistor 3 high, and level conversion thus accomplished.

The threshold voltage can also be changed in a CMOS inverter by changing the input transistor size. While the through-current flows in the steady state with a CMOS inverter, the through-current can be eliminated in the steady state with a level shifter, and low power consumption can thus be achieved.

It is therefore possible to achieve a high drive output voltage and increase the dynamic range while reducing the power supply voltage of the differential circuit 1, and thereby reduce power consumption, by reducing the power supply voltage of the differential circuit 1, lowering the output voltage $V_x$, and increasing the power supply voltage of the drive transistor 3.

The other effects of this second embodiment are identical to those of the first embodiment above.

Embodiment 3

The third embodiment of a differential amplifier according to the present invention is described below with reference to FIG. 6. In the differential amplifier of this embodiment, the constant current source transistor drives the pull-in current. More specifically, this differential amplifier comprises a differential circuit 1', output circuit 2', drive transistor 3' (an n-channel MOS transistor), and switching circuit 4' controlling the current supply to the drive transistor 3'.

In this differential circuit 1', the source of the n-channel MOS transistor 11' is grounded, and constant bias voltage $V'_{bias}$ is applied to the gate of said n-channel MOS transistor 11', thus causing the n-channel MOS transistor 11' to function as a constant current supply.

The sources of two n-channel MOS transistors 12' and 13' are commonly connected to the drain of the n-channel MOS transistor 11'. The drain of a p-channel MOS transistor 14' is connected to the drain of n-channel MOS transistor 12', and the drain of another p-channel MOS transistor 15' is connected to the drain of the other n-channel MOS transistor 13'.

The sources of the p-channel MOS transistors 14' and 15' are commonly connected to the power supply $V'_{DD}$ and the gates thereof are commonly connected to the drain of n-channel MOS transistor 13', i.e., to the drain of the one p-channel MOS transistor 15'.

In the output circuit 2', the source of the constant current source transistor 21', which is an n-channel MOS transistor, is connected to the ground, and a constant bias voltage $V'_{bias}$ is supplied to the gate thereof. The drain of the control transistor 22', which is a p-channel MOS transistor, is connected to the drain of the constant current source transistor 21', the source of the control transistor 22' is connected to the power supply $V'_{DD}$ and the gate is connected to the drain of the n-channel MOS transistor 12', which is the output terminal of the differential circuit 1'.

The source of the drive transistor 3' is grounded, and the drain is connected to a contact between the constant current source transistor (n-channel MOS transistor) 21' and the control transistor (p-channel MOS transistor) 22'. Thus, the drive transistor 3' is disposed in parallel with the constant current source transistor 21', and drives current in the same direction as the constant current source transistor 21'.

The switching circuit 4' comprises, for example, a pair of series circuits forming a two-stage inverter circuit, the one series circuit comprising an n-channel MOS transistor 41' and a p-channel MOS transistor 42', and the other series circuit comprising an n-channel MOS transistor 43' and a p-channel MOS transistor 44'. In particular, the n-channel MOS transistor 41' and p-channel MOS transistor 42' forming the first-stage inverter have a high threshold voltage setting (near power supply $V'_{DD}$), determined by the pattern design during circuit integration, and function to supply a drive signal and thus current to the drive transistor 3' when the output voltage $V'_x$ of the differential circuit 1' is greater than a particular threshold voltage, and to stop supplying the drive signal, and thus shut off the drive transistor 3', when said output voltage $V'_x$ is less than the particular threshold voltage.

A non-inverting input terminal 16' is disposed to the gate of the n-channel MOS transistor 12', an inverting input terminal 17' is disposed to the gate of the other n-channel MOS transistor 13', and output terminal 23' is disposed to the contact (common drain) between the constant current source transistor 21' and control transistor 22'.

Voltages V+' and V-' are the voltages applied to the non-inverting input terminal 16' and inverting input terminal 17', respectively, and each has a negative value. Current $i'_A$ is the current flowing to the constant current source transistor 21', current $i'_B$ is the current flowing from the control transistor 22', current $i'_c$ is the current flowing to the drive transistor 3', and current $i'_O$ is the current of output terminal 23'.

The operation of the third embodiment of a differential amplifier thus comprised is described below.

The differential circuit 1' of this differential amplifier outputs voltage $V'_x$ based on the difference between the voltage V+' applied to the non-inverting input terminal 16' and the voltage V-' applied to the inverting input terminal 17'. The constant current source transistor 21' of the output circuit 2' outputs a constant current (pull-in current) $i'_A$ which flows either in from the output terminal 23' or passes through the control transistor 22' as a through-current.

The current $i'_B$ (discharge current) flowing from the control transistor 22' varies according to the output voltage $V'_x$ of the differential circuit 1', and is the sum of the current $i'_A$ (through current) passing the constant current source transistor 21', and the current $i'_O$ flowing from the output terminal 23'. As a result, the current $i'_O$ to the output terminal 23' (or the current $-i'_O$ flowing from the output terminal 23') can be controlled by controlling the current $i'_B$ flowing through the control transistor 22'.

When the output voltage $V'_x$ of the differential circuit 1' is sufficiently high, and current $i'_B$ is less than current $i'_A$ the drive signal supplied by the switching circuit 4' permits the current $i'_c$ flowing to the drive transistor 3' to flow to the output terminal 23'. This results in faster discharging of the capacitive load connected to the output terminal 23' compared with when only current $i'_A$ flows to the output terminal 23', thus causing the voltage $V'_O$ of the output terminal 23' to drop rapidly.

It is to be noted that when the voltage $V'_O$ approaches the final (target) level, the output voltage $V'_x$ of the differential circuit 1' drops, and current $i'_B$ of the control transistor 22' begins flowing. At this time, however, the switching circuit 4' stops outputting the drive signal, and current $i'_c$ drops to zero, thus preventing a through-current from flowing through the drive transistor 3' and control transistor 22'.

When this differential amplifier is operating, a capacitive load C is connected to the output terminal 23', the voltage $V'_O$ of the output terminal 23' is fed directly to the inverting input terminal 17', or is fed back through a feedback capacitance. If it is assumed that there is no leakage current in the capacitive load C, the absolute value of the current $i'_A$ flowing from the constant current source transistor 21', and the absolute value of the current $i'_B$ flowing from the control transistor 22', will be equal, and will be stable when the current $i'_O$ to the output terminal 23', or the current $-i'_O$ flowing from the output terminal 23', is zero.

The output voltage $V'_x$ of the differential circuit 1' also changes each time the voltage V+' applied to the non-inverting input terminal 16' and the voltage V-' applied to the inverting input terminal 17' change, thus changing the current $i'_B$ flowing from the control transistor 22' and the current $i'_c$ flowing to the drive transistor 3'.

By thus controlling the levels of currents $i'_B$ and $i'_c$, and supplying all or part of current $i'_c$ from the drive transistor 3' and current $i'_A$ from the constant current source transistor 21' to the output terminal 23', the capacitive load C connected to the output terminal 23' can be discharged and the voltage $V'_O$ of the output terminal 23' decreased, or current can be pumped from the output terminal 23' through the control transistor 22' to charge the capacitive load C connected to the output terminal 23', and increase the voltage $V'_O$ of the output terminal 23'. A steady state can thus be resumed by raising or lowering the voltage $V'_O$ to return the output voltage $V'_x$ of the differential circuit 1' to the original (steady state) level.

Note that the pull-in and discharge states are precisely reversed from those shown in FIG. 2 as a result of the relationship between the output voltage $V'_x$ of the differential circuit 1', the currents $i'_A$ and $i'_B$ flowing through the output circuit 2', and the current $i'_c$ flowing to the drive transistor 3'.

The threshold voltage in this third embodiment is set higher than the output voltage $V'_x$ of the differential circuit 1' when current $i'_B$ starts flowing through the control transistor 22' to prevent a through-current flowing from the drive transistor 3' to the control transistor 22', i.e., to prevent current $i'_B$ of the control transistor 22' and current $i'_c$ of the drive transistor 3' (which flow relative to the output terminal 23' in opposite directions) from flowing at the same time, and thereby prevent an increase in power consumption. If the threshold voltage is set lower than the output voltage $V'_x$ of the differential circuit 1' when the absolute values of the current $i'_B$ flowing through the control transistor 22' and the current $i'_A$ flowing to the constant current source transistor 21' are equal, the steady state through-current is the same as in the prior art.

This third embodiment of a differential amplifier thus differs from the first embodiment in that it can accelerate the voltage drop of the output terminal voltage, but the effects thereof are otherwise the same as those of the first embodiment.

Figure 6:
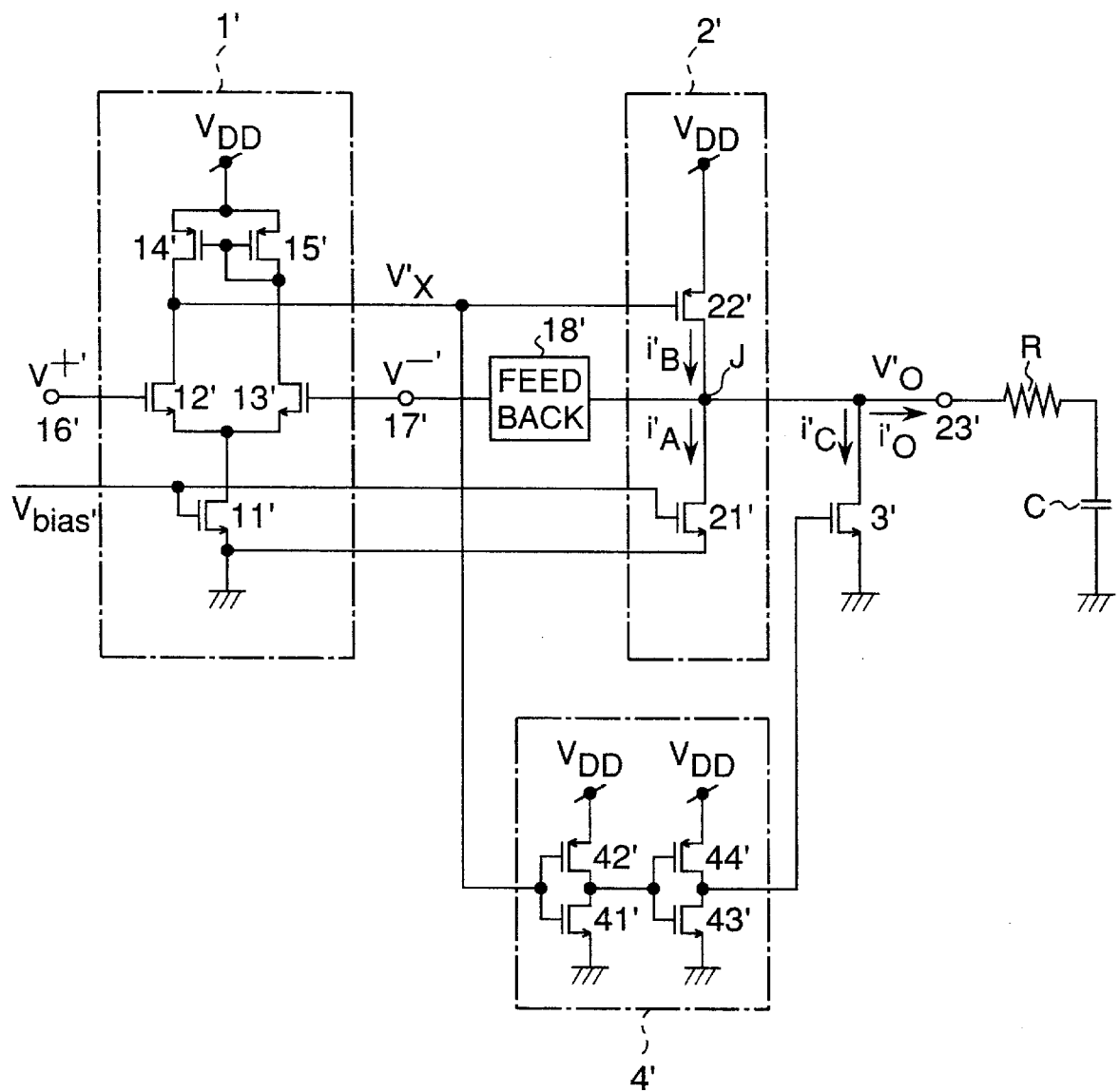
FIG. 6 is a circuit diagram of a differential amplifier according to the third embodiment of the present invention.

Further alternative embodiments of those shown in FIGS. 1 and 6 can be achieved by reversing the channel types shown, using a negative ($-V_{DD}$) power supply, and a negative bias voltage ($-V_{bias}$) In this case the current flows are also opposite those shown in FIGS. 1 and 6, but other operations are the same.

Embodiment 4

Figure 7:
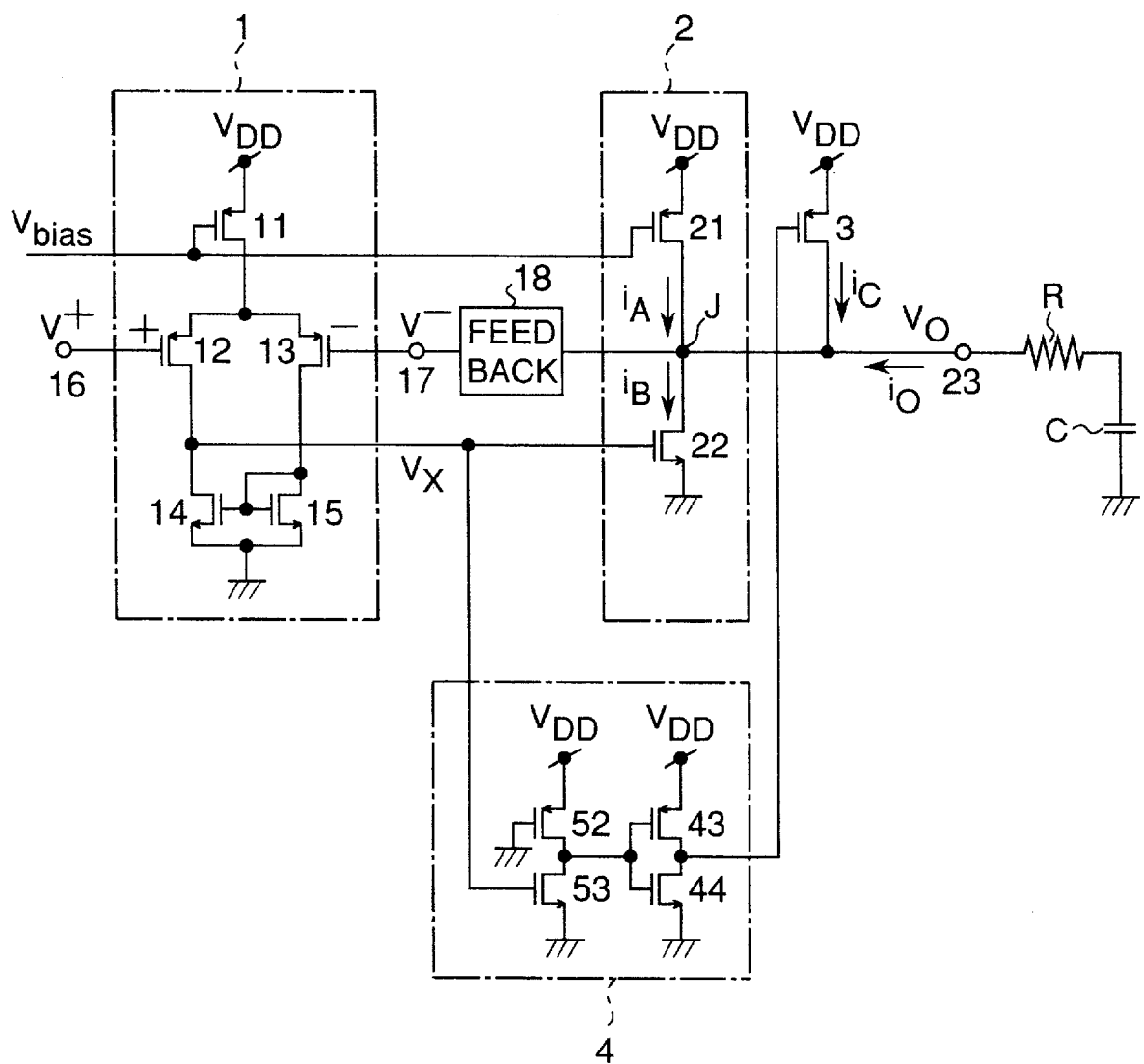
FIG. 7 is a circuit diagram of a differential amplifier according to the fourth embodiment of the present invention.

The fourth embodiment of a differential amplifier according to the present invention is described below with reference to FIG. 7. In the differential amplifier of this embodiment, the first-stage inverter of the switching circuit 4 shown in FIG. 7 is a series circuit comprising a p-channel MOS transistor 52 and an n-channel MOS transistor 53. With this switching circuit 4, the output of the differential circuit 1 is connected only to the gate of the n-channel MOS transistor 53, thus reducing the load capacity of the differential circuit 1, and increasing the operating speed of the switching circuit 4. As a result, the output voltage $V_O$ of the output circuit 2 can be forced to rise rapidly compared with the differential amplifier shown in FIG. 1.

Note, further, that the p-channel MOS transistor 52 shown in FIG. 7 has a grounded gate and functions as a resistance, thus reducing the through-current of the first-stage inverter and reducing power consumption.

The configuration and operation of this differential amplifier are otherwise identical to the first embodiment, and further description thereof is omitted below.

Embodiment 5

Figure 8:
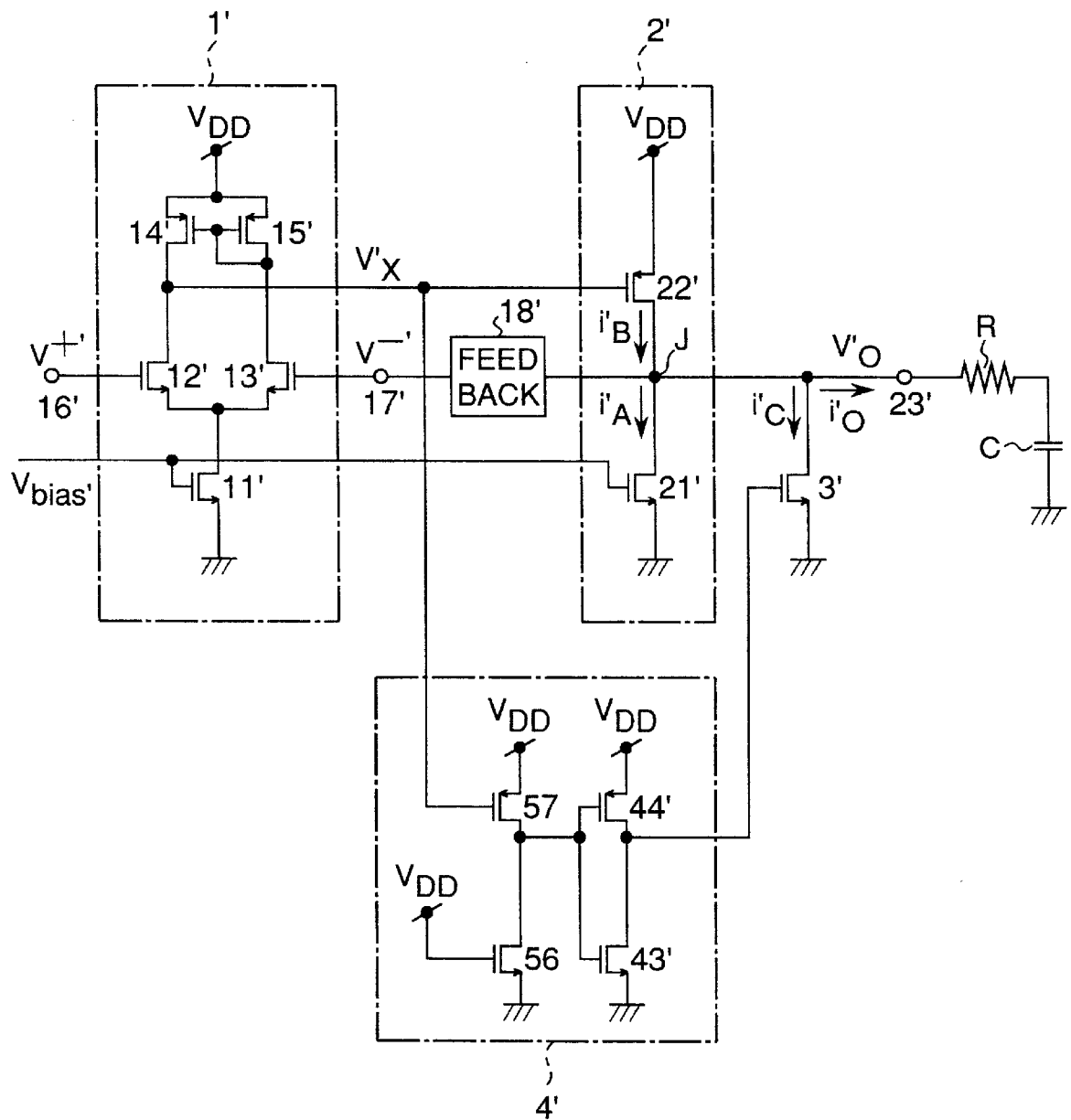
FIG. 8 is a circuit diagram of a differential amplifier according to the fifth embodiment of the present invention.

The fifth embodiment of a differential amplifier according to the present invention is described below with reference to FIG. 8. In the differential amplifier of this embodiment, the first-stage inverter of the switching circuit 4' shown in FIG. 8 is a series circuit comprising a p-channel MOS transistor 57 and an n-channel MOS transistor 56. With this switching circuit 4', the output of the differential circuit 1' is connected only to the gate of the p-channel MOS transistor 57, thus reducing the load capacity of the differential circuit 1', and increasing the operating speed of the switching circuit 4'. As a result, the output voltage $V'_O$ of the output circuit 2' can be forced to drop rapidly compared with the differential amplifying apparatus shown in FIG. 6.

The configuration and operation of this differential amplifier are otherwise identical to the third embodiment, and further description thereof is omitted below.

Embodiment 6

The sixth embodiment of a differential amplifier according to the present invention is described below with reference to FIG. 9. In the first-stage inverter of the switching circuit 4 shown in FIG. 9 of this embodiment, a p-channel MOS transistor 62 is inserted to the current path from the power supply $V_{DD}$ to the p-channel MOS transistor 52, an n-channel MOS transistor 63 is connected in parallel with the n-channel MOS transistor 53, and the gate voltage of the p-channel MOS transistor 62 and the n-channel MOS transistor 63 is varied by a control voltage $V_c$ synchronized to the input voltage V+ of the differential circuit 1. It is therefore possible to interrupt the p-channel MOS transistor 62 when current is supplied to the n-channel MOS transistor 53, and thereby supply current to the n-channel MOS transistor 63, or to supply current to the p-channel MOS transistor 62 when the n-channel MOS transistor 53 is cut off, and thereby cut off the n-channel MOS transistor 63.

With the differential amplifier thus comprised, the through-current of the first-stage inverter can be shut off when current is flowing to the n-channel MOS transistor 53 by shutting off the p-channel MOS transistor 62, and the n-channel MOS transistor 63 can fix the output voltage of the first-stage inverter to the ground potential to suppress the through-current of the second-stage inverter. As a result, power consumption by the switching circuit 4 can be suppressed more efficiently than in the fourth embodiment by providing p-channel MOS transistor 62 and n-channel MOS transistor 63.

Figure 9:
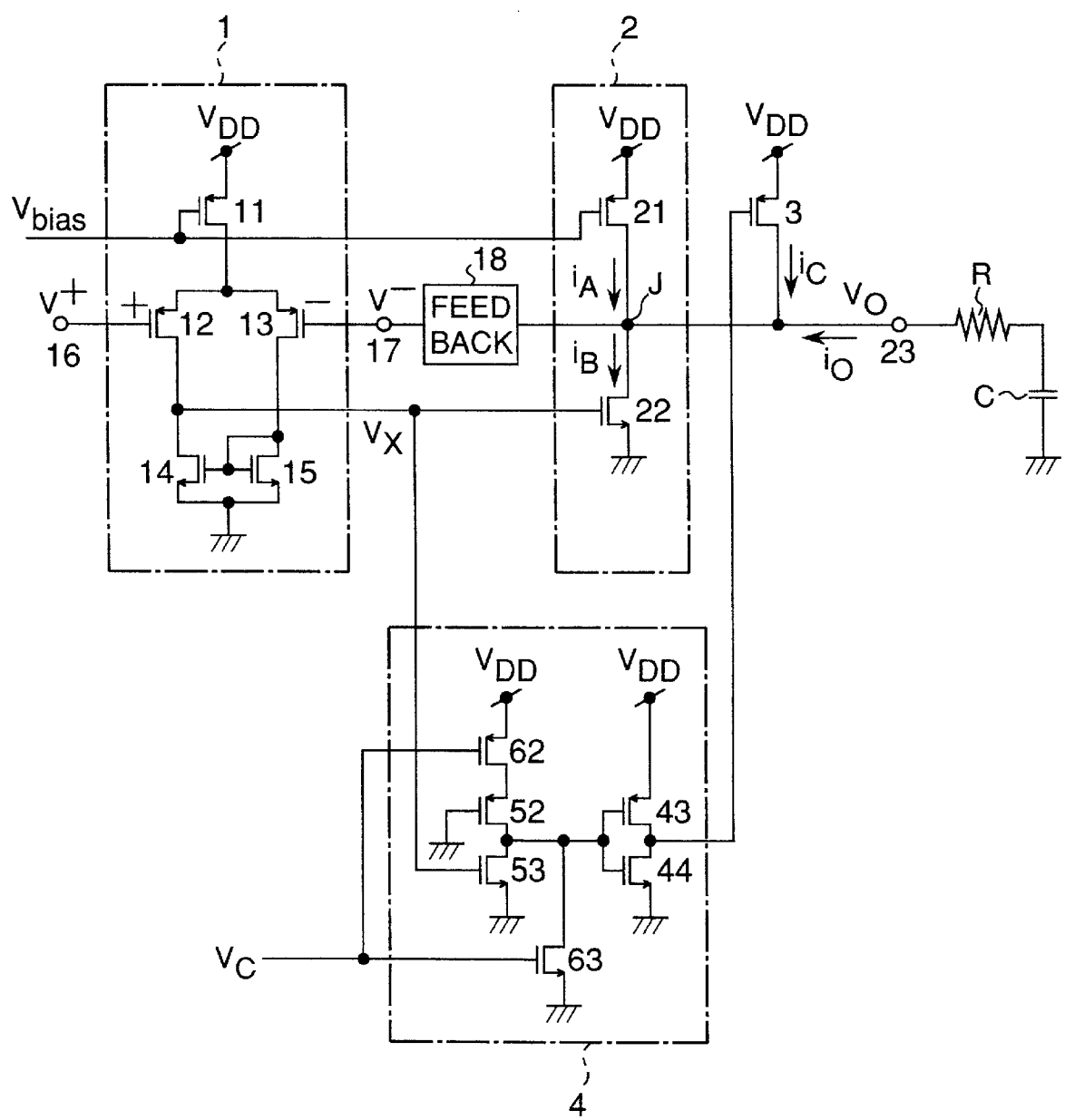
FIG. 9 is a circuit diagram of a differential amplifying apparatus according to the sixth embodiment of the present invention.

The operation of the differential amplifier shown in FIG. 9 is described next referring to the timing chart in FIG. 3.

When the input voltage V+ of the non-inverting input terminal 16 drops ($V_A \rightarrow V_B$), control signal $V'_c$ (FIG. 34) changes from HIGH to LOW, p-channel MOS transistor 62 becomes on, and n-channel MOS transistor 63 becomes off.

When the input voltage V+ rises ($V_B \rightarrow V_A$), control signal $V_c$ changes from LOW to HIGH, p-channel MOS transistor 62 becomes off to prevent a through-current from passing the first-stage inverter, and n-channel MOS transistor 63 becomes ON to fix the output of the first-stage inverter to LOW. The input to the first-stage inverter can thus control the on/off states of the p-channel MOS transistor 43 and n-channel MOS transistor 44, i.e., can turn only one transistor 43 or 44 on, to reduce power consumption as a result of the through-current.

The basic configuration and operation of this embodiment are otherwise identical to the differential amplifier of the fourth embodiment shown in FIG. 7, and further description is therefore omitted below.

It is possible that the control voltage $V_c$ is controlled manually, and not synchronized to the input voltage V+ of the differential circuit 1. When it is necessary to disable the switching circuit 4, a high level control voltage $V_c$ is applied manually by a suitable switch (not shown). In this case, the transistor 63 turns on, and transistor 43 turns on. Thus, a high level signal is forcibly applied to the gate of transistor 3 to maintain the transistor 3 in off state.

It is to be further noted that the sixth embodiment described above is identical to the fourth embodiment shown in FIG. 7 with the addition of the p-channel MOS transistor 62 and n-channel MOS transistor 63. This embodiment can therefore be described as an alternative embodiment of a differential amplifier according to the first embodiment shown in FIG. 1 with the addition of the p-channel MOS transistor 62 and n-channel MOS transistor 63 thereto, in which case the effects will still be as described above.

Embodiment 7

Figure 10:
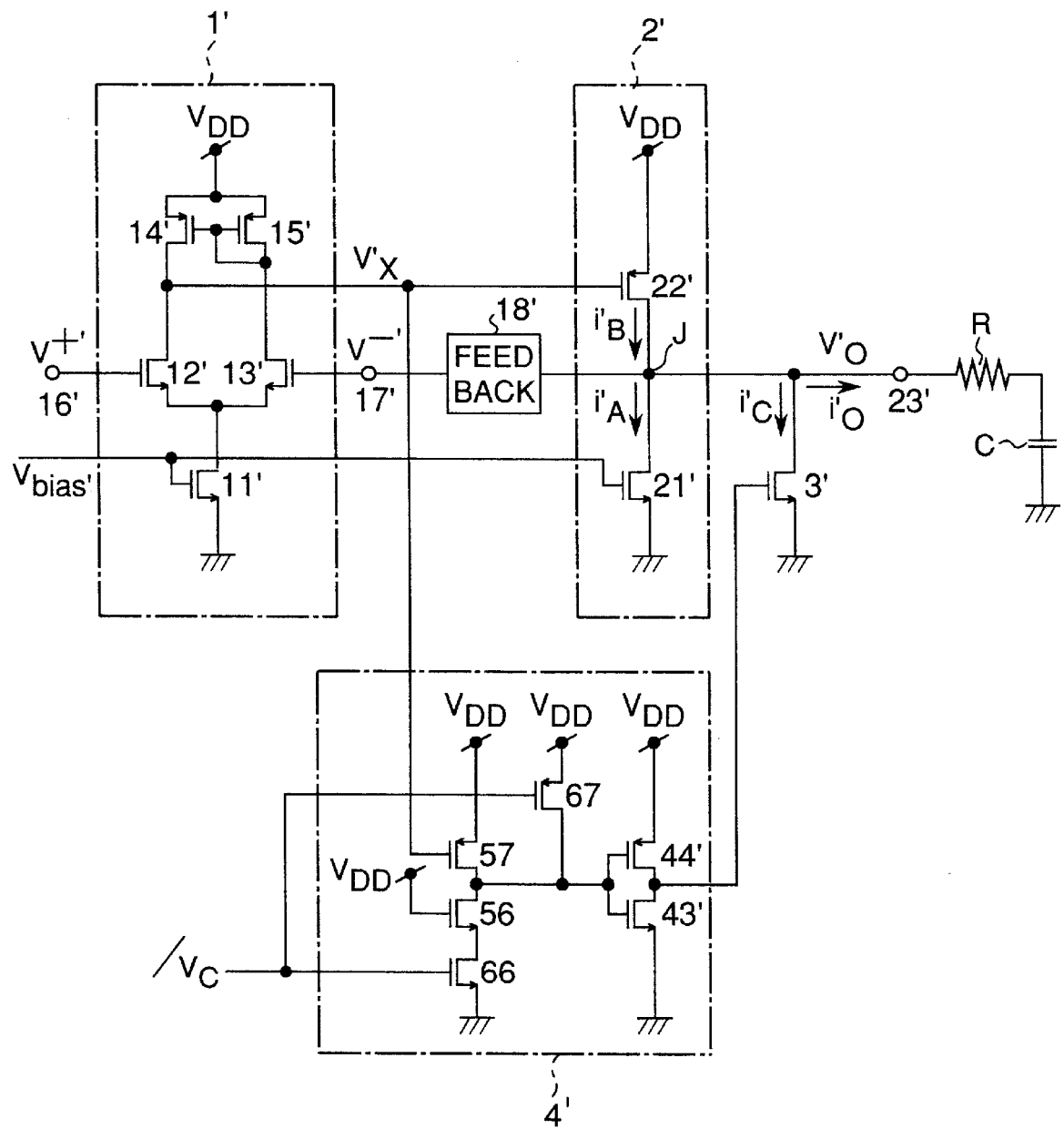
FIG. 10 is a circuit diagram of a differential amplifier according to the seventh embodiment of the present invention.

The seventh embodiment of a differential amplifier according to the present invention is described below with reference to FIG. 10. In the first-stage inverter of the switching circuit 4' shown in FIG. 10, a p-channel MOS transistor 67 is connected in parallel with the p-channel MOS transistor 57, an n-channel MOS transistor 66 is inserted in the current path from the n-channel MOS transistor 56 to the ground, and the gate voltage of the p-channel MOS transistor 67 and the n-channel MOS transistor 66 is varied by a control voltage $/V_c$ (where $/V_c$ indicates the inverted control voltage $V_c$) synchronized to the input voltage V+' of the differential circuit 1'. It is therefore possible to supply current to the p-channel MOS transistor 67, and thereby cut off the n-channel MOS transistor 66, when current is supplied to the p-channel MOS transistor 57, or when p-channel MOS transistor 57 is shut off to shut off the p-channel MOS transistor 67 and thereby supply current to the n-channel MOS transistor 66.

With the differential amplifier thus comprised, the through-current of the first-stage inverter can be shut off when current is flowing to the p-channel MOS transistor 57 by shutting off the n-channel MOS transistor 66, and the p-channel MOS transistor 67 can fix the output voltage of the first-stage inverter to the power supply potential to suppress the through-current of the second-stage inverter. As a result, power consumption by the switching circuit 4' can be suppressed more efficiently than in the fifth embodiment by providing p-channel MOS transistor 67 and n-channel MOS transistor 66.

The basic configuration and operation of this embodiment are otherwise identical to the differential amplifier of the fifth embodiment shown in FIG. 8, and further description is therefore omitted below.

It is to be further noted that the present embodiment described above has been described as the differential amplifier of the fifth embodiment shown in FIG. 8 with a p-channel MOS transistor 67 and an n-channel MOS transistor 66 added thereto. This embodiment can therefore be described as an alternative embodiment of a differential amplifier according to the third embodiment shown in FIG. 4 with the addition of a p-channel MOS transistor 67 and an n-channel MOS transistor 66 added thereto, in which case the effects will still be as described above.

Also, as in the sixth embodiment, it is possible that the control voltage /Vc is controlled manually, and not synchronized to the input voltage V+' of the differential circuit 1'. When it is necessary to disable the switching circuit 4', a low level control voltage /Vc is applied manually by a suitable switch (not shown). In this case, the transistor 66 turns off and transistor 67 turns on, and transistor 43' turns on. Thus, a low level signal is forcibly applied to the gate of transistor 3' to maintain the transistor 3' in off state.

Embodiment 8

Figure 11:
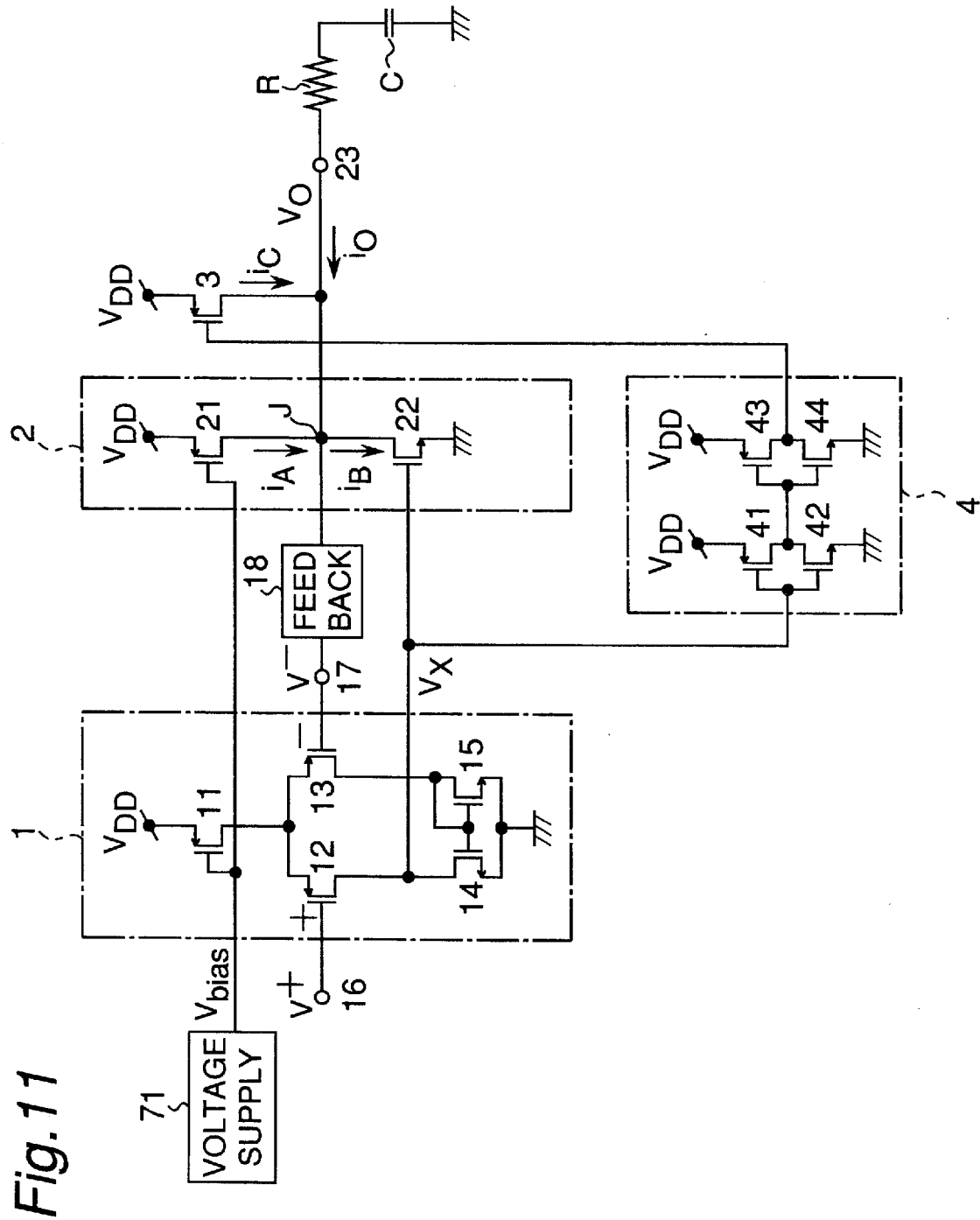
FIG. 11 is a circuit diagram of a differential amplifier according to the eighth embodiment of the present invention.

An eighth embodiment of a differential amplifier is described next with reference to FIG. 11. As shown in FIG. 11, this differential amplifier supplies the constant bias voltage $V_{bias}$ applied to the gates of the p-channel MOS transistor 11 in the differential circuit 1 and the constant current source transistor 21 of the output circuit 2 through a variable voltage bias voltage supply 71, and is otherwise identical to the first embodiment in FIG. 1.

It is therefore possible to reduce power consumption by adjusting the current of the constant current supplies (11, 21) by increasing or decreasing the constant bias voltage $V_{bias}$. More specifically, while a capacitive load is connect-ed to the differential amplifier of this embodiment during operation, the constant bias voltage $V_{bias}$ can be increased or decreased to supply the minimum required current even when the load conditions change, thereby maintaining low power consumption while increasing the operating speed.

It is to be noted that the above embodiment whereby the constant bias voltage $V_{bias}$ is increased or decreased can be achieved not only with the differential amplifier of the first embodiment shown in FIG. 1, but in any of the differential amplifiers shown in FIGS. 4–10.

According to the present invention, the drive transistor is provided in parallel with the constant current supply transistor of the output circuit, a switching circuit to which is input the output voltage of the differential circuit is provided, and current is supplied to the drive transistor only when the differential circuit output voltage is sufficiently low and current is either not flowing or is flowing at a sufficiently low level through the control transistor. It is therefore possible to supply a sufficiently high current level from the drive transistor to the output terminal, accelerate the voltage rise of the output terminal, and cut off the drive transistor in the steady state, even when the current flowing to the constant current supply transistor is set low, and the through current flowing to the constant current supply transistor and the control transistor in the steady state are thereby reduced. It is thus possible to achieve a high throughput rate, and reduce power consumption.

With a differential amplifier according to the present invention, it is possible to prevent current flowing simultaneously to the control transistor and the drive transistor, and thereby further reduce power consumption.

It is further possible in a semiconductor circuit using a p-type substrate to eliminate the effects of substrate bias voltage.

It is further possible by using a CMOS inverter design to change the threshold value of the inverter during circuit integration.

In addition, the differential circuit output voltage is applied only to the fourth n-channel MOS transistor forming part of the first-stage inverter, thus decreasing the load capacity of the differential circuit, increasing the operating speed of the switching circuit, and thus accelerating the rise of the output voltage from the output circuit. The sixth p-channel MOS transistor also provides a resistance function, decreasing the through current of the first-stage inverter, and reducing power consumption.

In addition, the through current of the first-stage inverter is interrupted when current is supplied to the fourth n-channel MOS transistor by interrupting the eighth p-channel MOS transistor, and the sixth n-channel MOS transistor fixes the output voltage of the first-stage inverter to the ground potential, thereby suppressing the through current of the second-stage inverter, and suppressing power consumption by the switching circuit as a result.

With a differential amplifier according to the present invention, the drive transistor is provided in parallel with the constant current supply transistor of the output circuit, a switching circuit to which is input the output voltage of the differential circuit is provided, and current is supplied to the drive transistor only when the differential circuit output voltage is sufficiently high and current is either not flowing or is flowing at a sufficiently low level to the control transistor. It is therefore possible through supply a sufficiently high current level from the drive transistor to the output terminal, accelerate the voltage drop of the output terminal, and cut off the drive transistor in the steady state, even when the current flowing to the constant current supply transistor is set low, and the through current flowing through the constant current supply transistor and the control transistor in the steady state are thereby reduced. It is thus possible to achieve a high throughput rate, and reduce power consumption.

With a differential amplifier according to the present invention, it is possible to prevent current flowing simultaneously to the control transistor and the drive transistor, and thus further reduce power consumption.

It is also possible to eliminate the effects of the substrate bias voltage when applied in a semiconductor circuit using an n-type substrate.

It is also possible to adjust the threshold value of the inverter during circuit integration when a CMOS inverter structure is used.

In addition, the differential circuit output voltage is applied only to the fourth p-channel MOS transistor forming part of the first-stage inverter, thus decreasing the load capacity of the differential circuit, increasing the operating speed of the switching circuit, and thus accelerating the rise of the output voltage from the output circuit. The sixth n-channel MOS transistor also provides a resistance function, decreasing the through current of the first-stage inverter, and reducing power consumption.

In addition, the through current of the first-stage inverter is interrupted when current is supplied to the fourth p-channel MOS transistor by interrupting current to the eighth n-channel MOS transistor, and the sixth p-channel MOS transistor fixes the output voltage of the first-stage inverter to the power supply potential, thereby suppressing the through current of the first-stage inverter, and suppressing power consumption by the switching circuit as a result.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A differential amplifier comprising:
a differential circuit, comprising a non-inverting input and an inverting input, for outputting a difference voltage relative to a difference between a first voltage applied to the non-inverting input and a second voltage applied to the inverting input;
an output circuit comprising a constant current supply transistor for supplying a constant current, and a control transistor controlled by said difference voltage, and a junction between said supply transistor and said control transistor;
a drive transistor connected to said junction for supplying current in a same direction as said constant current supply transistor; and
a switching circuit for supplying a drive signal to said drive transistor to enable said drive transistor when said difference voltage is below a predetermined threshold voltage, and to disable said drive transistor when said difference voltage is above said predetermined threshold voltage.

2. A differential amplifier according to claim 1, wherein said predetermined threshold voltage is set to a value less than the difference voltage obtained when absolute values of the currents flowing through said constant current supply transistor and said control transistor are equal.

3. A differential amplifier according to claim 1, wherein said predetermined threshold voltage is set to a value less than the difference voltage obtained when current begins to flow through the control transistor.

4. A differential amplifier according to claim 1, wherein said differential circuit comprises:
a first p-channel MOS transistor having a constant bias voltage applied to the gate thereof;
second and third p-channel MOS transistors, the sources of said second and third p-channel MOS transistors being connected to the drain of said first p-channel MOS transistor, the gate of said second p-channel MOS transistor being connected to said non-inverting input and the gate of said third p-channel MOS transistor being connected to said inverting input, and
first and second n-channel MOS transistors, the drain of said first n-channel MOS transistor being connected to the drain of said second p-channel MOS transistor and the drain of said second n-channel MOS transistor being connected to the drain of said third p-channel MOS transistor the gates of said first and second n-channel MOS transistors being connected in common and to one of the drains thereof, and the sources of said first and second n-channel MOS transistors being connected in common.

5. A differential amplifier according to claim 4, wherein said constant current supply transistor is a fourth p-channel MOS transistor having said constant bias voltage applied to the gate thereof;
the control transistor is a third n-channel MOS transistor, having said difference voltage applied to the gate thereof; and
the drive transistor is a fifth p-channel MOS transistor, having said drive signal from said switching circuit applied to the gate thereof.

6. A differential amplifier according to claim 5, wherein said switching circuit comprises a first inverter circuit and a second inverter circuit connected in series.

7. A differential amplifier according to claim 6, wherein said first inverter circuit comprises a sixth p-channel MOS transistor, to the gate of which is applied said difference voltage, and a fourth n-channel MOS transistor, to the gate of which is also applied said difference voltage, and wherein said second inverter circuit comprises a seventh p-channel MOS transistor, to the gate of which is applied an output voltage of the first inverter circuit, and a fifth n-channel MOS transistor, to the gate of which is applied the output voltage of the first inverter circuit.

8. A differential amplifier according to claim 6, wherein said first inverter circuit comprises a sixth p-channel MOS transistor, the gate of which is grounded, and a fourth n-channel MOS transistor, to the gate of which is applied said difference voltage, and wherein said second inverter circuit comprises a seventh p-channel MOS transistor, to the gate of which is applied an output voltage of the first inverter circuit, and a fifth n-channel MOS transistor, to the gate of which is also applied the output voltage of the first inverter circuit.

9. A differential amplifier according to claim 7, wherein said switching circuit further comprises:
an eighth p-channel MOS transistor connected to a current path for supplying current to said sixth p-channel MOS transistor; and
a sixth n-channel MOS transistor connected in parallel to said fourth n-channel MOS transistor.

10. A differential amplifier according to claim 8, wherein said switching circuit further comprises:
an eighth p-channel MOS transistor connected to a current path for supplying current to said sixth p-channel MOS transistor; and
a sixth n-channel MOS transistor connected in parallel to said fourth n-channel MOS transistor.

11. A differential amplifier comprising:
a differential circuit, comprising a non-inverting input and an inverting input, for outputting a difference voltage relative to a difference between a first voltage applied to the non-inverting input and a second voltage applied to the inverting input;
an output circuit comprising a constant current supply transistor for supplying a constant current, and a control transistor controlled by said difference voltage, and a junction between said supply transistor and said control transistor;
a drive transistor connected to said junction for supplying current in a same direction as said constant current supply transistor; and
a switching circuit for supplying a drive signal to said drive transistor to enable said drive transistor when said difference voltage is above a predetermined threshold voltage, and to disable said drive transistor when said difference voltage is below said predetermined threshold voltage.

12. A differential amplifier according to claim 11, wherein said predetermined threshold voltage is set to a value greater than the difference voltage obtained when absolute values of the currents flowing through said constant current supply transistor and said control transistor are equal.

13. A differential amplifier according to claim 11, wherein said predetermined threshold voltage is set to a value greater than the difference voltage obtained when current begins to flow through the control transistor.

14. A differential amplifier according to claim 11, wherein said differential circuit comprises:
a first n-channel MOS transistor having a constant bias voltage applied to the gate thereof;
second and third n-channel MOS transistors, the sources of said second and third n-channel MOS transistors being connected to the drain of said first n-channel MOS transistor, the gate of said second n-channel MOS transistor being connected to said non-inverting input and the gate of said third n-channel MOS transistor being connected to said inverting input, and first and second p-channel MOS transistors, the drain of said first p-channel MOS transistor being connected to the drain of said second n-channel MOS transistor and the drain of said second p-channel MOS transistor being connected to the drain of said third n-channel MOS transistor, the gates of said first and second p-channel MOS transistors being connected in common and to one of the drains thereof, and the sources of said first and second p-channel MOS transistors being connected in common.

15. A differential amplifier according to claim 14, wherein said constant current supply transistor is a fourth n-channel MOS transistor, having said constant bias voltage applied to the gate thereof;

the control transistor is a third p-channel MOS transistor, having said difference voltage applied to the gate thereof; and the drive transistor is a fifth n-channel MOS transistor, having said drive signal from said switching circuit applied to the gate thereof.

16. A differential amplifier according to claim 15, wherein said switching circuit comprises a first inverter circuit and a second inverter circuit connected in series.

17. A differential amplifier according to claim 16, wherein said first inverter circuit comprises a sixth n-channel MOS transistor, to the gate of which is applied said difference voltage, and a fourth p-channel MOS transistor, to the gate of which is also applied said difference voltage, and wherein said second inverter circuit comprises a seventh n-channel MOS transistor, to the gate of which is applied an output voltage of the first inverter circuit, and a fifth p-channel MOS transistor, to the gate of which is applied the output voltage of the first inverter circuit.

18. A differential amplifier according to claim 16, wherein said first inverter circuit comprises a sixth n-channel MOS transistor, the gate of which is provided with a constant voltage, and a fourth p-channel MOS transistor, to the gate of which is applied said difference voltage, and wherein said second inverter circuit comprises a seventh n-channel MOS transistor, to the gate of which is applied an output voltage of the first inverter circuit, and a fifth p-channel MOS transistor, to the gate of which is also applied the output voltage of the first inverter circuit.

19. A differential amplifier according to claim 17, wherein said switching circuit further comprises:

an eighth n-channel MOS transistor connected to a current path for supplying current to said sixth n-channel MOS transistor; and a sixth p-channel MOS transistor connected in parallel to said fourth p-channel MOS transistor.

20. A differential amplifier according to claim 18, wherein said switching circuit further comprises:

an eighth n-channel MOS transistor connected to a current path for supplying current to said sixth n-channel MOS transistor; and a sixth p-channel MOS transistor connected to parallel to said fourth p-channel MOS transistor.

* * * * *